United States Patent
Cho et al.

(10) Patent No.: US 8,159,867 B2
(45) Date of Patent: *Apr. 17, 2012

(54) PHASE CHANGE MEMORY DEVICES AND SYSTEMS, AND RELATED PROGRAMMING METHODS

(75) Inventors: Woo-Yeong Cho, Suwon-si (KR); Kwang-Jin Lee, Hwaseong-si (KR); Hye-Jin Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 495 days.

This patent is subject to a terminal disclaimer.

(21) Appl. No.: 12/395,999

(22) Filed: Mar. 2, 2009

(65) Prior Publication Data

US 2009/0161421 A1 Jun. 25, 2009

Related U.S. Application Data

(63) Continuation of application No. 11/727,711, filed on Mar. 28, 2007, now Pat. No. 7,529,124.

(30) Foreign Application Priority Data

Apr. 6, 2006 (KR) .................. 10-2006-0031494

(51) Int. Cl.
*G11C 11/00* (2006.01)
(52) U.S. Cl. .. 365/163; 365/113; 365/148; 365/189.011
(58) Field of Classification Search .................. 365/163, 365/148, 113, 100, 189.11
See application file for complete search history.

(56) References Cited

U.S. PATENT DOCUMENTS

| | | | |
|---|---|---|---|
| 6,075,719 A | 6/2000 | Lowrey et al. | |
| 6,928,022 B2 | 8/2005 | Cho et al. | |
| 6,967,865 B2 | 11/2005 | Lee | |
| 6,982,913 B2 | 1/2006 | Oh et al. | |
| 7,042,760 B2 | 5/2006 | Hwang et al. | |
| 7,050,328 B2 | 5/2006 | Khouri et al. | |
| 7,295,462 B2* | 11/2007 | Farnworth | 365/158 |
| 7,518,934 B2* | 4/2009 | Bedeschi et al. | 365/189.18 |
| 7,529,124 B2* | 5/2009 | Cho et al. | 365/163 |

(Continued)

FOREIGN PATENT DOCUMENTS

JP 07254291 A 10/1995

(Continued)

OTHER PUBLICATIONS

Bedeschi, Ferdinando et al.; "A Bipolar-Selected Phase Change Memory Featuring Multi-Level Cell Storage"; IEEE Journal of Solid-State Circuits, vol. 44, No. 1, Jan. 2009, pp. 217-227.

*Primary Examiner* — Pho M Luu
(74) *Attorney, Agent, or Firm* — Volentine & Whitt, PLLC

(57) ABSTRACT

A phase change memory device performs a program operation by receiving program data to be programmed in selected memory cells, sensing read data already stored in the selected memory cells by detecting respective magnitudes of verify currents flowing through the selected memory cells when a verify read voltage is applied to the selected memory cells, determining whether the read data is identical to the program data, and upon determining that the program data for one or more of the selected memory cells is not identical to the corresponding read data, programming the one or more selected memory cells with the program data.

28 Claims, 18 Drawing Sheets

U.S. PATENT DOCUMENTS

| | | | |
|---|---|---|---|
| 7,729,163 B2 * | 6/2010 | Ramani et al. | 365/163 |
| 7,894,236 B2 * | 2/2011 | Oh et al. | 365/148 |
| 2008/0074918 A1 | 3/2008 | Ro et al. | |
| 2008/0123389 A1 | 5/2008 | Cho et al. | |

FOREIGN PATENT DOCUMENTS

| | | |
|---|---|---|
| KR | 1020000029264 A | 5/2000 |
| KR | 1020050085619 A | 8/2005 |
| WO | 2004055827 A1 | 7/2004 |

* cited by examiner

PHASE CHANGE MEMORY DEVICES AND SYSTEMS, AND RELATED PROGRAMMING METHODS

CROSS-REFERENCE TO RELATED APPLICATION

This is a continuation of application Ser. No. 11/727,711 filed on Mar. 28, 2007, which issued as U.S. Pat. No. 7,529,124, on May 5, 2009, and which is incorporated herein by reference in its entirety.

BACKGROUND OF THE INVENTION

1. Field of the Invention

Embodiments of the invention relate generally to semiconductor memory devices. More particularly, embodiments of the invention relate to phase change memory devices and systems, and related programming methods.

A claim of priority is made to Korean Patent Application No. 2006-0031494 filed on Apr. 6, 2006, the disclosure of which is hereby incorporated by reference in its entirety.

2. Description of Related Art

Phase change memory devices store data using phase change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

Phase change memory devices typically use the amorphous state to represent a logical "1" and the crystalline state to represent a logical "0". The crystalline state is generally referred to as a "set state", and the amorphous state is referred to as a "reset state". Accordingly, phase change memory cells in the phase change memory devices typically store a logical "0" ("SET data") by "setting" a phase change material in the memory cells to the crystalline state, and the phase change memory cells store a logical "1" ("RESET data") by "resetting" the phase change material to the amorphous state. A phase change memory cell having the "reset state" can be said to store "RESET data" and a phase change memory cell having the "set state" can be said to store "SET data". Various phase change memory devices are disclosed, for example, U.S. Pat. Nos. 6,487,113 and 6,480,438.

The phase change material in a phase change memory device is typically converted to the amorphous state by heating the material to above a predetermined melting temperature and then quickly cooling the material. The phase change material is typically converted to the crystalline state by heating the material at another predetermined temperature below the melting temperature for a period of time. Accordingly, data is written to memory cells in a phase change memory device by converting the phase change material in memory cells of the phase change memory device between the amorphous and crystalline states using heating and cooling as described.

The phase change material in a phase change memory device typically comprises a compound including germanium (Ge), antimony (Sb), and tellurium (Te), i.e., a "GST" compound. The GST compound is well suited for a phase change memory device because it can quickly transition between the amorphous and crystalline states by heating and cooling.

At least one type of phase change memory cell comprises a top electrode, a chalcogenide layer, a bottom electrode contact, a bottom electrode, and an access transistor or a diode, wherein the chalcogenide layer is the phase change material of the phase change memory cell. Accordingly, a read operation is performed on the phase change memory cell by measuring the resistance of the chalcogenide layer, and a program operation is performed on the phase change memory cell by heating and cooling the chalcogenide layer as described above. A phase change memory cell typically further comprises a switching element used to control a supply of current to the phase change material for program operations.

FIG. 1 is a schematic block diagram and a circuit diagram illustrating one type of conventional phase change memory cell. The phase change memory cell of FIG. 1 comprises a resistor and a switching element (shown by circuit symbols in a broken oval). The resistor comprises a phase change layer 1, an upper electrode 2 formed above phase change layer 1, and a lower electrode 3 formed below phase change layer 1. In the example of FIG. 1, phase change layer 1 comprises the phase change material for the phase change memory cell.

As described above, the phase of the phase change material can be transformed by temperature changes. For example, the phase change memory cell of FIG. 1 can be programmed by closing the switching element to supply a current to the resistor. When the current is supplied to the resistor, lower electrode 3 heats up, causing phase change layer 1 to heat up.

Accordingly, as described above, the phase change memory cell of FIG. 1 can be programmed to the amorphous, or "reset" state by heating phase change layer 1 to a temperature T1 using lower electrode 3 and then quickly cooling phase change layer 1. Similarly, the phase change memory cell of FIG. 1 can be programmed to the crystalline, or "set" state by heating phase change layer 1 to a second temperature T2 (T2<T1) and maintaining phase change layer 1 at temperature T2 using lower electrode 3, and then and then cooling phase change layer 1. In one example, T1 is roughly equal to 1 ns and T2 is around 30-50 ns.

As an example, FIG. 2 is a graph illustrating a temperature profile of a phase change memory cell during a program operation. As seen in FIG. 2, the phase change memory cell is programmed to the reset state by applying a current "i1" to the phase change memory cell for a first time period to heat the phase change material within the phase change memory cell to above temperature T1. After the phase change material reaches temperature T1, current "i1" is no longer applied to the phase change memory cell and the phase change material rapidly cools.

The phase change memory cell is programmed to the set state by applying a current "i2" to the phase change memory cell for a second time period longer than the first time period. Current "i2" heats the phase change material to above temperature T2 and maintains the phase change material above temperature T2 throughout the second time period. Then, after the second time period, current "i2" is no longer applied to the phase change memory cell, allowing the phase change material to cool.

An amount of heat "J" applied to phase change layer 1 is proportional to $I^2R$, where "I" denotes a magnitude of a current "I" flowing through lower electrode 3, and "R" denotes a resistance "R" of lower electrode 3. Resistance "R" is proportional to a cross-sectional area of lower electrode 3, and the cross-sectional area of lower electrode 3 is proportional to $\pi r^2$, where "r" denotes a radius "r" of lower electrode 3. Therefore, heat "J" applied to phase change layer 1 is generated in proportion to the square of the radius of lower electrode 3. In other words, heat "J" is proportional to $r^2$.

The lower electrodes of different phase change memory cells in a phase change memory device tend to have slightly different radii due to minor variations in processes used to form the phase change memory cells. As a result, the amount of heat generated around each of the lower electrodes will vary, even when the same voltage is applied to each of the phase change memory cells. These different amounts of heat will lead to differences in the respective resistances of corresponding phase change layers. Accordingly, phase change memory cells programmed to the same state may have different resistances.

The resistances of phase change memory cells (or in other words, the resistance of the corresponding phase change materials) within a phase change memory device typically exhibit bell shaped distributions. As a result, a state of a phase change memory cell is typically determined by comparing the resistance of the phase change memory cell with a reference read resistance between the distributions corresponding to the crystalline state and the amorphous state. To properly distinguish between the crystalline and amorphous states, the reference read resistance is located within a read margin between a minimum value of the distribution corresponding to the amorphous state and a maximum value of the distribution corresponding to the crystalline state.

Unfortunately, the distributions corresponding to the crystalline and amorphous states may be so close to each other that the read margin may be undesirably small. Where the read margin of the phase change memory cells is undesirably small, the reliability of the phase change memory device tends to be degraded because smaller read margins make it increasingly difficult for the reference read resistance to distinguish between the crystalline and amorphous states.

SUMMARY OF THE INVENTION

According to one embodiment of the invention, a method of performing a program operation in a phase change memory device is provided. The method comprises receiving program data to be programmed in selected memory cells, sensing read data stored in the selected memory cells by detecting respective magnitudes of verify currents flowing through the selected memory cells when a verify read voltage is applied to the selected memory cells, determining whether the read data is identical to the program data, and upon determining that the program data for one or more of the selected memory cells is not identical to the corresponding read data, programming the one or more selected memory cells with the program data.

According to another embodiment of the invention, a phase change memory device is provided. The phase change memory device comprises a memory cell array comprising a plurality of phase change memory cells arranged in rows and columns, a column select circuit adapted to select a subset of the columns in response to a column address, and a data input/output (IO) buffer circuit adapted to temporarily store program data to be programmed to selected memory cells among the plurality of phase change memory cells in the memory cell array. The phase change memory device further comprises a sense amplifier circuit adapted to supply respective verify currents to the selected memory cells via the selected columns during a verify read section of a program operation. Each of the respective verify currents has a magnitude corresponding to the program data to be programmed to a corresponding one of the selected memory cells. The phase change memory device still further comprises a control logic unit adapted to generate pulse signals for programming the selected memory cells during a program execution section of the program operation, wherein each individual pulse signal among the pulse signals is generated based on a determination that a bit among the program data is not identical to a corresponding bit of read data stored in a corresponding one of the selected memory cells to be programmed using the individual pulse signal, and a write driver circuit adapted to supply respective program currents to the selected columns using the pulse signals.

According to still another embodiment of the invention, a system is provided. The system comprises a bus, a microprocessor connected to the bus, and a phase change memory device connected to the bus and adapted to store data processed or to be processed by the microprocessor.

BRIEF DESCRIPTION OF THE DRAWINGS

Embodiments of the invention are described below in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 3:
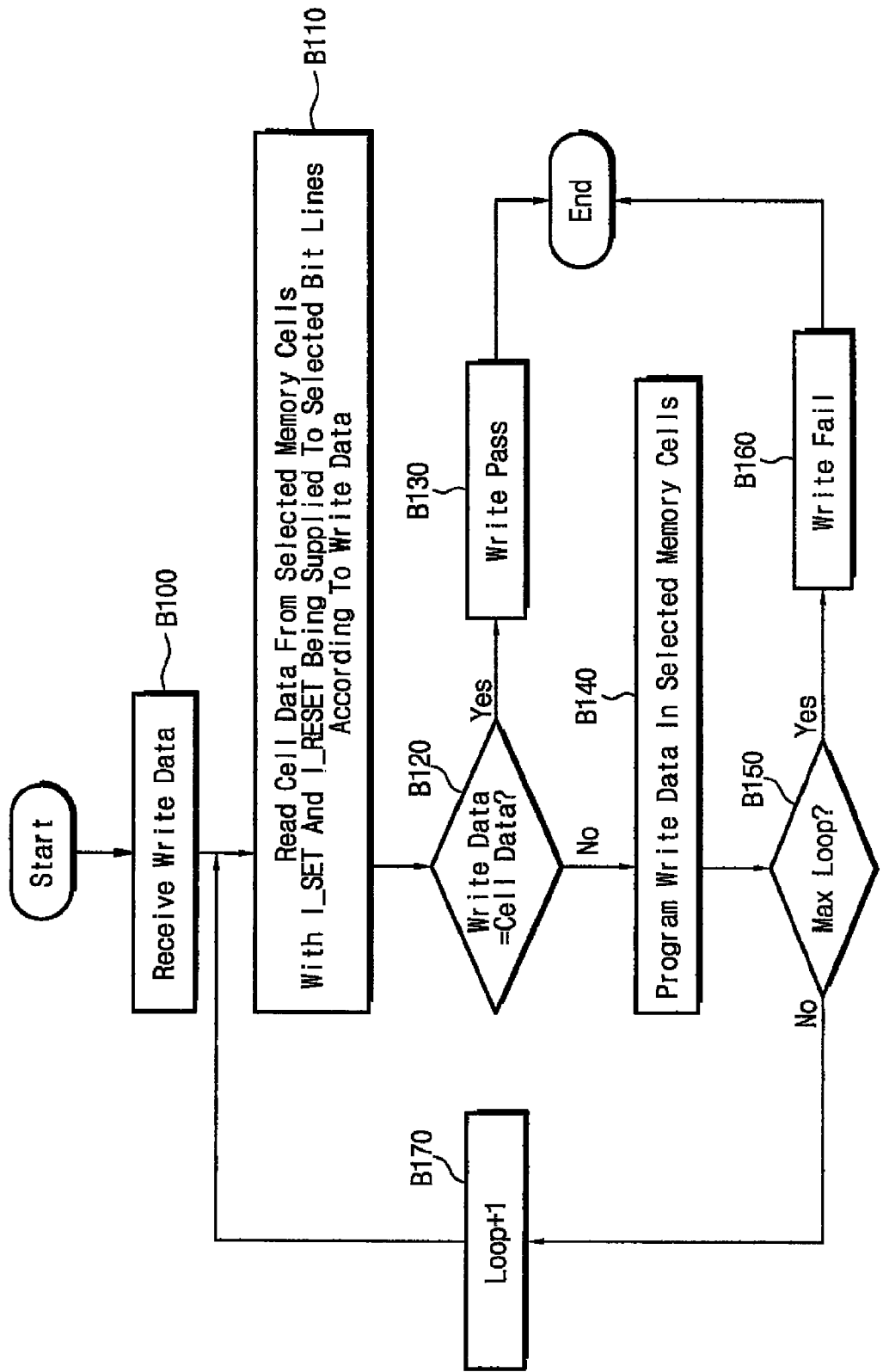
FIG. 3 is a flowchart illustrating a method of programming a phase change memory device according to one embodiment of the present invention.
Figure 4:
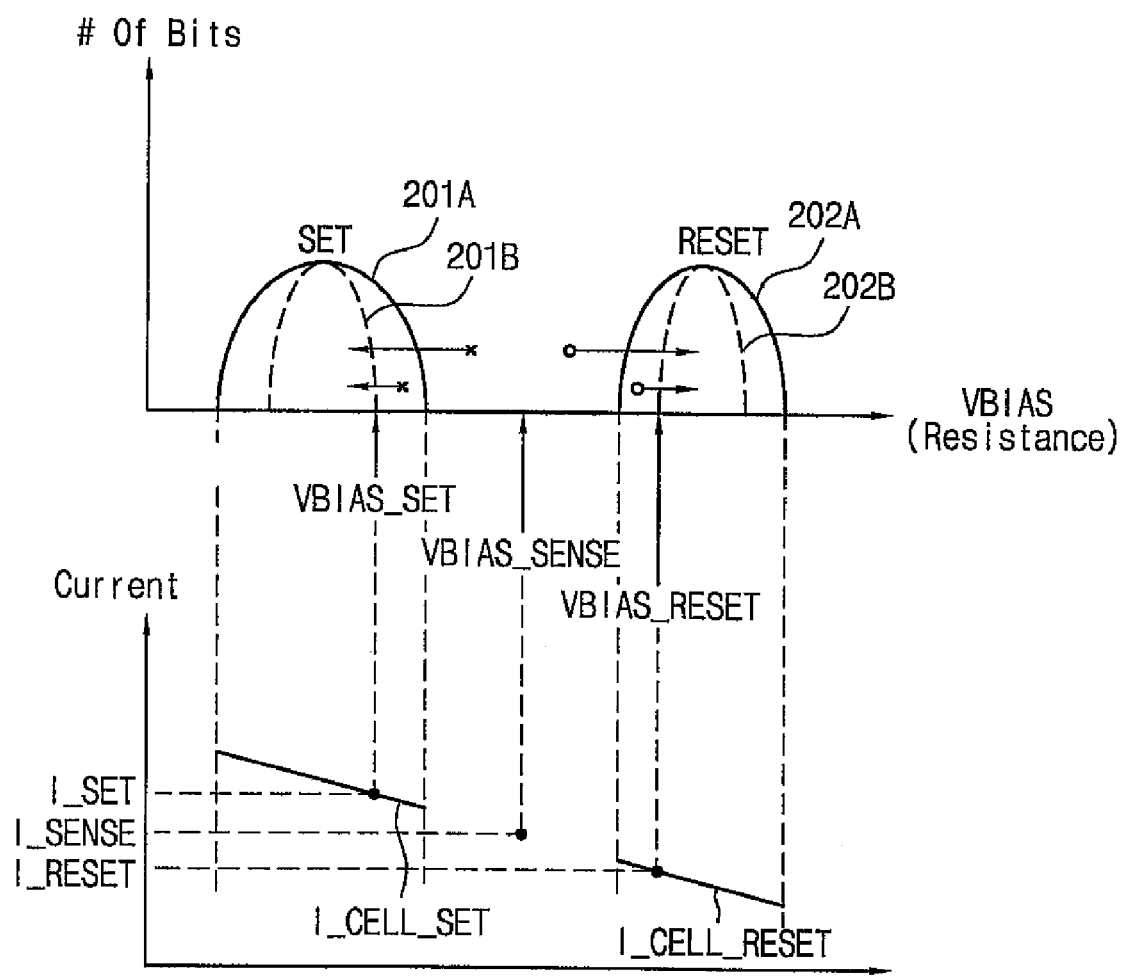
FIG. 4 is a graph illustrating resistance distributions for set and reset states of phase change memory cells in a phase change memory device according to one embodiment of the present invention.

FIG. 3 is a flowchart illustrating a method of programming a phase change memory device according to one embodiment of the present invention. FIG. 4 includes a first graph illustrating resistance distributions for set and reset states of the phase change memory cells in a phase change memory device according to one embodiment of the present invention, and a second graph illustrating program current characteristics corresponding to the resistance distributions illustrated in the first graph.

Figure 5:
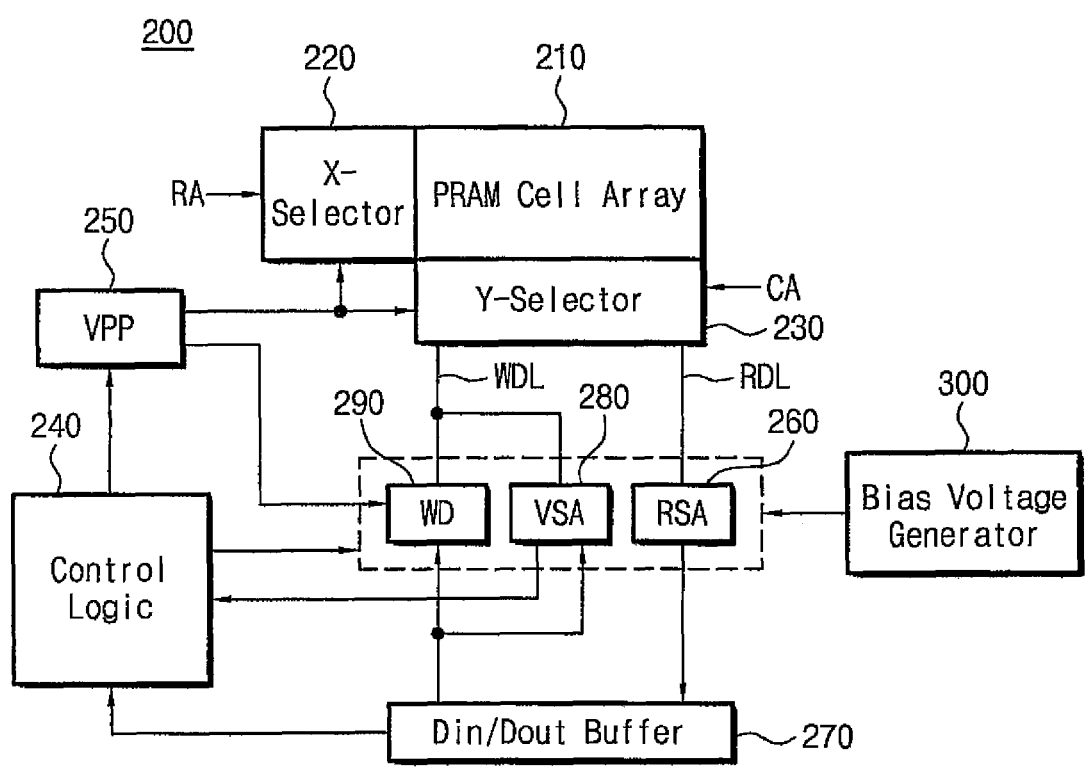
FIG. 5 is a block diagram illustrating a phase change memory device according to one embodiment of the present invention.

In this written description, exemplary method steps are denoted by parentheses (BXXX), to distinguish them from exemplary device or system elements such as those illustrated, for example, in FIG. 5.

Referring to FIG. 3, the phase change memory device receives program data (also referred to as "write data") to be programmed in selected memory cells (B100). After receiving the program data, the phase change memory device reads cell data stored in the selected memory cells (B110). Next, the phase change memory device compares the cell data with the program data and determines whether the program data is identical to the cell data stored in the selected memory cells (B120). Where the cell data is the identical to the program data (B120=Yes), the phase change memory device generates a "write pass" or "program pass" indication (B130) and the program operation terminates.

Otherwise, where the cell data is not identical to the program data (B120=No), the phase change memory device re-programs the program data into the selected memory cells (B140). Next, the phase change memory device determines whether a predetermined maximum number of program loops including steps B110, B120, and B140 have been performed (B150). Where the maximum number of program loops have been performed (B150=Yes), the phase change memory device generates a "write fail" or "program fail" indication (B160) and the method terminates. Otherwise (B150=No), the phase change memory device increments a loop number variable denoting the number of program loops that have been performed (B170), and step B10 is repeated. Each time that step B10 is performed, other steps follow, as indicated by the arrows in FIG. 3.

Steps B120 and B130 can be referred to collectively as a "verify read section", and steps B140, B150 and B170 can be referred to collectively as a "write execution section" or "program execution section".

Referring to FIG. 4, curves labeled 201A and 201B represent resistance distributions of phase change memory cells in the set state, and curves labeled 202A and 202B represent resistance distributions of phase change memory cells in the reset state. In FIG. 4, resistance is measured on the x-axis and a number of phase change memory cells having each resistance is measured on the y-axis. Alternatively, the x-axis may represent a bias voltage required to turn on the phase change memory cells.

In FIG. 4, a curve labeled 201A represents a resistance distribution for phase change memory cells in the set state when the phase change memory cells are programmed using a conventional programming method. On the other hand, a dotted curve labeled 201B represents a resistance distribution for phase change memory cells in the set state when the phase change memory cells are programmed using the programming method illustrated in FIG. 3. Similarly, a curve labeled 202A represents a resistance distribution for phase change memory cells in the reset state when the phase change memory cells are programmed using a conventional programming method, and a dotted curve labeled 202B represents a resistance distribution for phase change memory cells in the reset state when the phase change memory cells are programmed using the programming method illustrated in FIG. 3.

In step B110 of FIG. 3, the phase change memory device uses different bias voltages to read the cell data stored in the selected memory cells than the bias voltages used in normal read operations. In other words, different bias voltages are used for read verify operations than for normal read operations.

For example, where the program data for a selected memory cell is a logical "1" corresponding to the RESET state, a verify current I_RESET current is applied to the selected memory cell through a corresponding bit line, as illustrated in FIG. 4. Verify current I_RESET current is generated using a bias voltage VBIAS_RESET applied to a bias current supply circuit. Where the selected memory cell has a lower resistance than a resistance corresponding to bias voltage VBIAS_RESET for generating verify current I_RESET, the selected memory cell will be determined to be in the SET state. In this case, the program execution section of the method of FIG. 3 is repeated for the selected memory cell.

On the other hand, where the program data for the selected memory cell is a logical "0" corresponding to the SET state, a verify current I_SET is applied to the selected memory cell through the corresponding bit line, as illustrated in FIG. 4. Verify current I_SET is generated using a bias voltage VBIAS_SET applied to the bias current supply circuit. Where the selected memory cell has higher resistance than a resistance corresponding to bias voltage VBIAS_SET for generating verify current I_SET, the selected memory cell will be determined to be in the RESET state. In this case, the program execution section of the method of FIG. 3 is repeated for the selected memory cell.

By selectively repeating the program execution section on selected memory cells as described above, the RESET and SET state distributions for the selected memory cells are narrowed as illustrated in FIG. 4. As a result, a sending margin between the SET state distribution and the RESET state distribution is increased. In other words, it is possible to improve a read margin of the phase change memory device. In addition to improving the read margin for 1-bit data, the method of FIG. 3 could also be used to distinguish between multiple resistance distributions so that multi-bit data could be stored in phase change memory cells.

FIG. 5 is a block diagram illustrating a phase change memory device according to one embodiment of the present invention.

Referring to FIG. 5, a phase change memory device 200 comprises a memory cell array 210 wherein each memory cell stores N-bit data (N is an integer greater than 0). Although not shown in detail in FIG. 5, memory cell array 210 comprises a plurality of rows corresponding to word lines and columns corresponding to bit lines, and memory cells arranged in a matrix at intersections between the bit lines and word lines.

Figure 1:
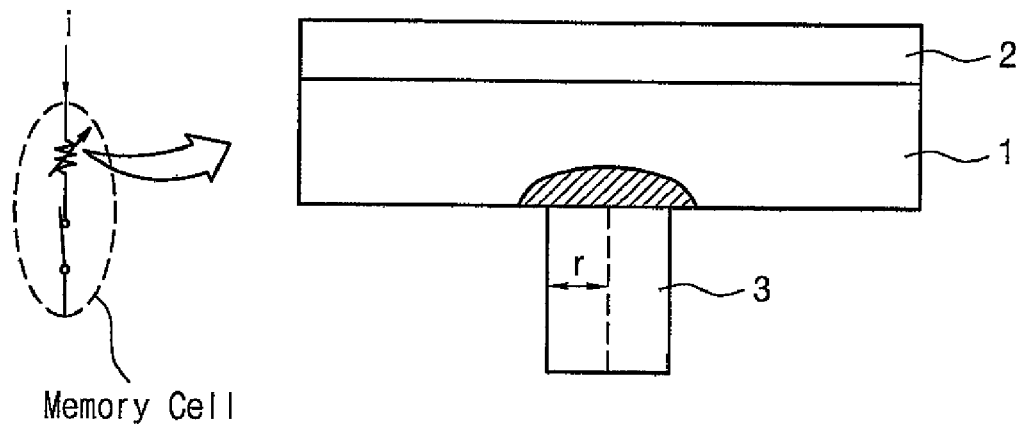
FIG. 1 is a schematic view illustrating a cell structure of a conventional phase change memory device.
Figure 2:
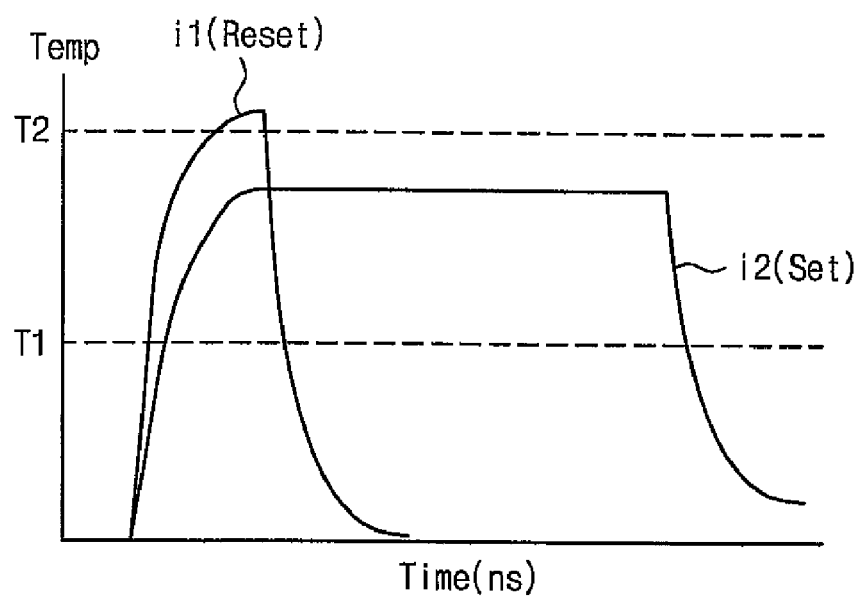
FIG. 2 is a graph illustrating a temperature profile of a phase change memory cell during program operations.

Each of the memory cells in memory cell array 210 typically comprises a switching device and a resistor such as that illustrated in FIG. 1. In general, the switching device may be embodied by various elements such as a metal-oxide semiconductor (MOS) transistor or a diode. In addition, each memory cell in memory cell array 210 is an over-writable memory cell. Examples of memory cells that could be used in memory cell array 210 are described in U.S. Pat. No. 6,928,022 entitled "write Drive Circuit in Phase Change Memory Device and Method for Applying Write Current", U.S. Pat. No. 6,967,865 entitled "Low-Current and High-Speed Phase-Change Memory Devices and Methods of Driving The Same", and U.S. Pat. No. 6,982,913 entitled "Data Read Circuit for Use in a Semiconductor Memory and a Memory Thereof". The respective disclosures of these Patents are hereby incorporated by reference.

A row select circuit 220 selects at least one word line among the plurality of word lines in response to a row address RA, and a row select circuit 230 selects a subset of the plurality of bit lines in response to a column address CA. A control logic unit 240 is configured to control overall operations of phase change memory device 200 in response write/read commands from an external source. A high voltage generating circuit 250 is controlled by control logic unit 240, and is configured to generate a high voltage used by row and column select circuits 220 and 230 and a write driver circuit 290. For example, high voltage generating circuit 250 may comprise a charge pump. However, those skilled in the art will recognize that high voltage generating circuit 250 could be embodied by a variety of other elements besides a charge pump.

A first sense amplifier circuit 260, labeled RSA, is controlled by control logic unit 240, and senses cell data through bit lines selected by column select circuit 230 in a normal read operation. The sensed data is output via a data input/output buffer circuit 270. First sense amplifier circuit 260 is connected to a data bus RDL and applies sense current I_SENSE to data bus RDL in the normal read operation. A second sense amplifier circuit 280, labeled VSA, is also controlled by control logic unit 240 and senses cell data through the bit lines selected by column select circuit 230 using program data stored in data input/output buffer circuit 270 during the verify read operation. Second sense amplifier circuit 280 variably applies verify current I_SET or I_RESET to the selected bit lines according to program data temporarily stored in data input/output buffer circuit 270.

Cell data sensed by second sense amplifier circuit 280 is applied to control logic unit 240. Control logic unit 240 determines whether or not the cell data sensed by second sense amplifier circuit 280 is identical to the program data stored in data input/output circuit 270. Control logic unit 240 controls write driver circuit 290 according a result of this determination. For instance, where the program data is determined to be identical to the sensed data, control logic unit 240 does not generate set and reset pulse signals corresponding to program data. On the other hand, where the program data value is determined not to be identical to the sensed data, control logic unit 240 generates set and reset pulse signals corresponding to the program data, or in other words, a program loop is repeated.

With each repetition of the program loop, control logic unit 240 controls write drive circuit 290 such an amount of a write current I_SET_W or I_RESET_W applied to selected bit lines in the program loop increases or decreases gradually. A bias voltage generating circuit 300 is controlled by control logic unit 240, and is configured to generate bias voltages to be applied to first and second sense amplifier circuits 260 and 280 and write driver circuit 290, respectively.

Figure 6:
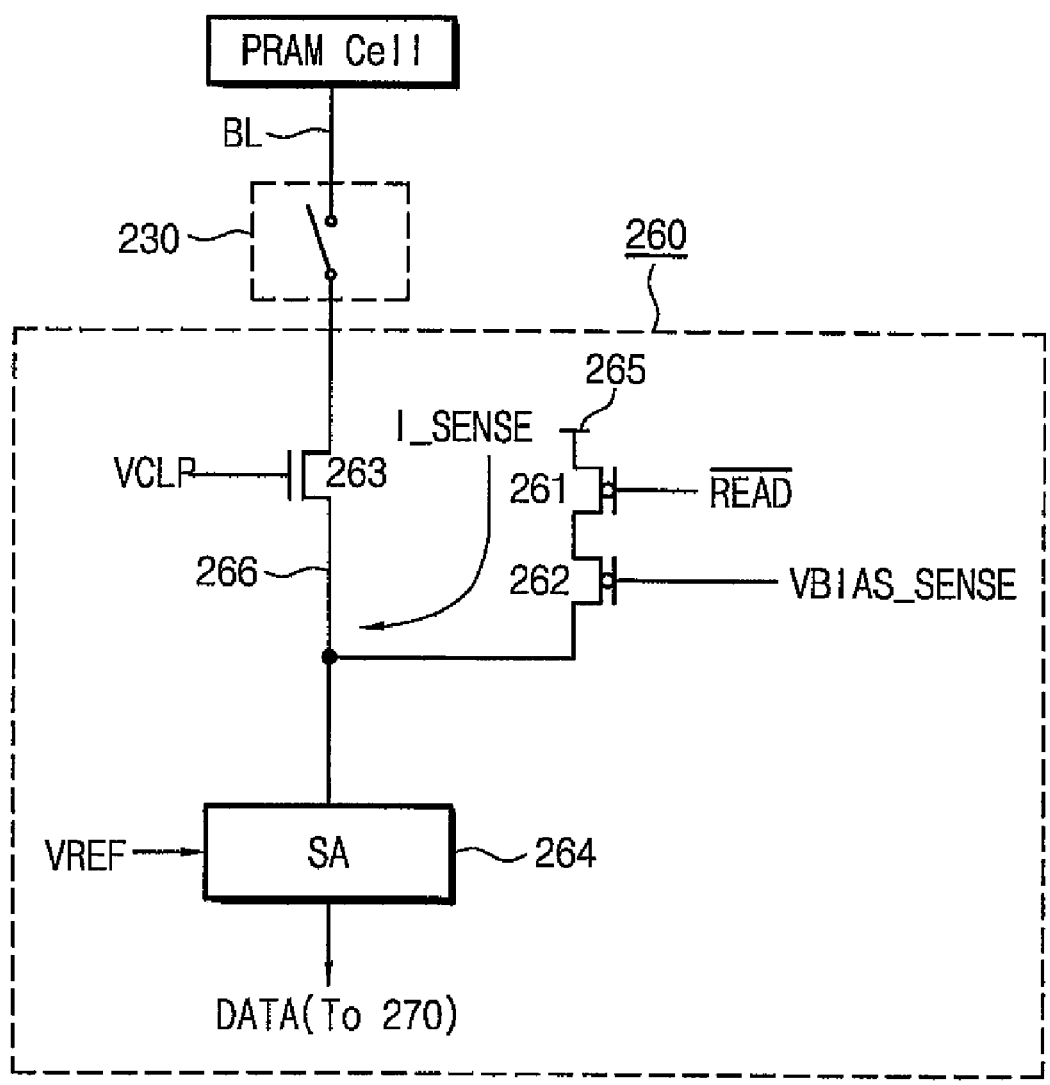
FIG. 6 is a circuit diagram illustrating an embodiment of a first sense amplifier circuit illustrated in FIG. 5.

FIG. 6 is a circuit diagram illustrating first sense amplifier circuit 260 shown in FIG. 5. First sense amplifier circuit 260 shown in FIG. 6 corresponds to a single bit line; however, phase change memory device 200 typically includes a similar first sense amplifier circuit for each bit line. For instance, where phase change memory device 200 comprises eight bit lines, eight first sense amplifier circuits corresponding to the eight bit lines are typically included.

Referring to FIG. 6, first sense amplifier circuit 260 comprises positive metal-oxide semiconductor (PMOS) transistors 261 and 262, a negative metal-oxide semiconductor (NMOS) transistor 263, and a sense amplifier 264. PMOS transistors 261 and 262 are connected in series between a power terminal 265 and a signal line 266, wherein a voltage corresponding to a power voltage or higher may be applied to power terminal 265. PMOS transistor 261 turns on/off in response to a control signal /READ indicating a normal read operation, and PMOS transistor 262 turns on/off in response to a bias voltage VBIAS_SENSE. Control signal /READ is supplied from control logic unit 240 of FIG. 5, and bias voltage VBIAS_SENSE is supplied from bias voltage generating circuit 300 of FIG. 5. NMOS transistor 263 is connected between signal line 266 and column select circuit 230, and is controlled by a clamp voltage VCLP to restrict a bit line voltage. Clamp voltage VCLP is used for maintaining the bit line voltage below a threshold voltage at which the RESET state of the phase change layer is changed. Sense amplifier 264, labeled SA, senses whether the bit line voltage is above or below a reference voltage VREF through column select circuit 230, and outputs a sensed result to data input/output buffer circuit 270 as the cell data.

PMOS transistors 261 and 262 constitute a sense current supplying part supplying current, i.e., sense current I_SENSE, to signal line 266 and bit line BL, in the normal read operation, wherein the magnitude of sense current I_SENSE is determined by bias voltage VBIAS_SENSE. Sense current I_SENSE is typically generated when bias voltage VBIAS_SENSE between bias voltages VBIAS_SET and VBIAS_RESET is applied to sense current supplying part 261 and 262. Sense current I_SENSE is applied to a selected memory cell through the bit line in the normal read operation.

Figure 7A:
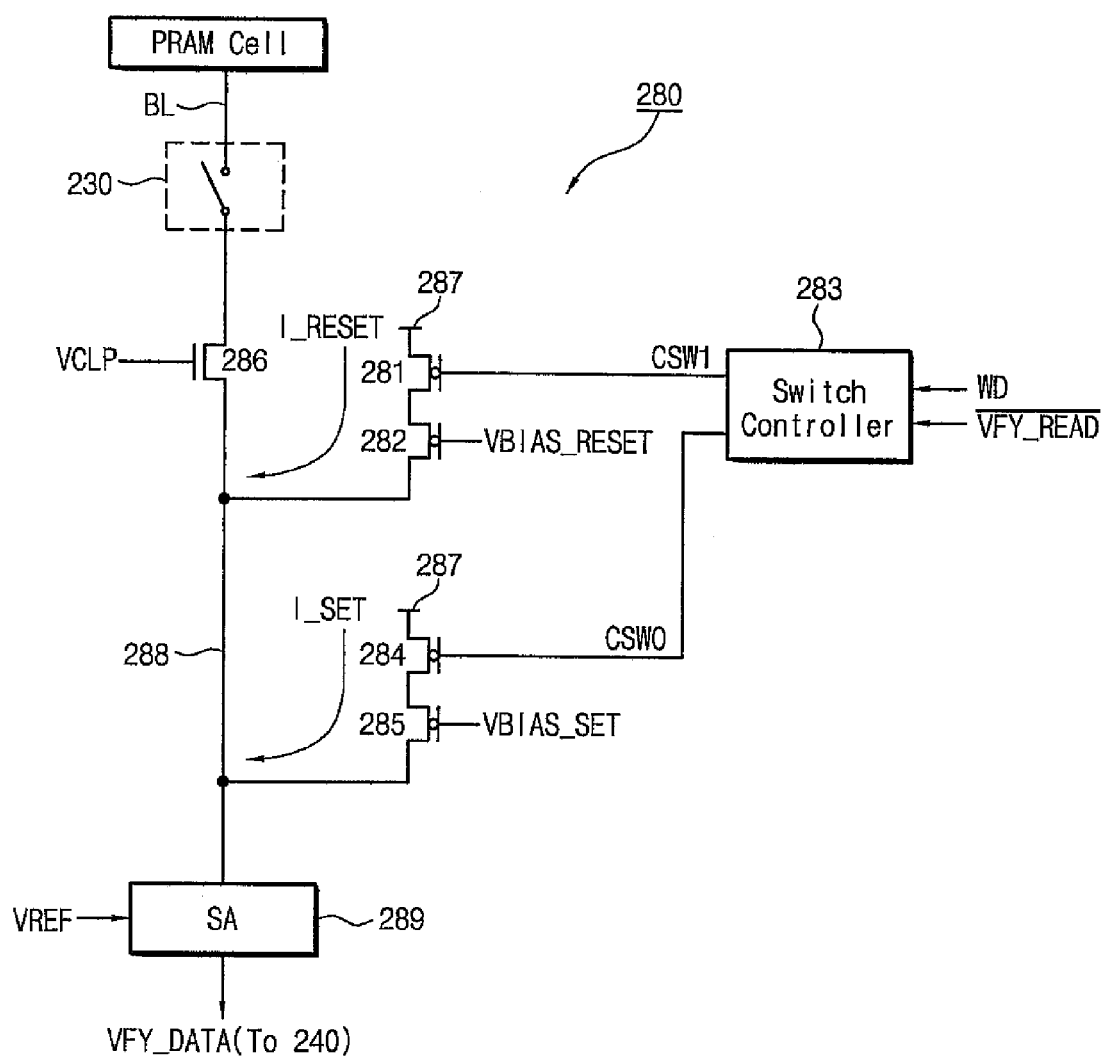
FIGS. 7A and 7B are circuit diagrams illustrating embodiments of a second sense amplifier circuit illustrated in FIG. 5.
Figure 7B:
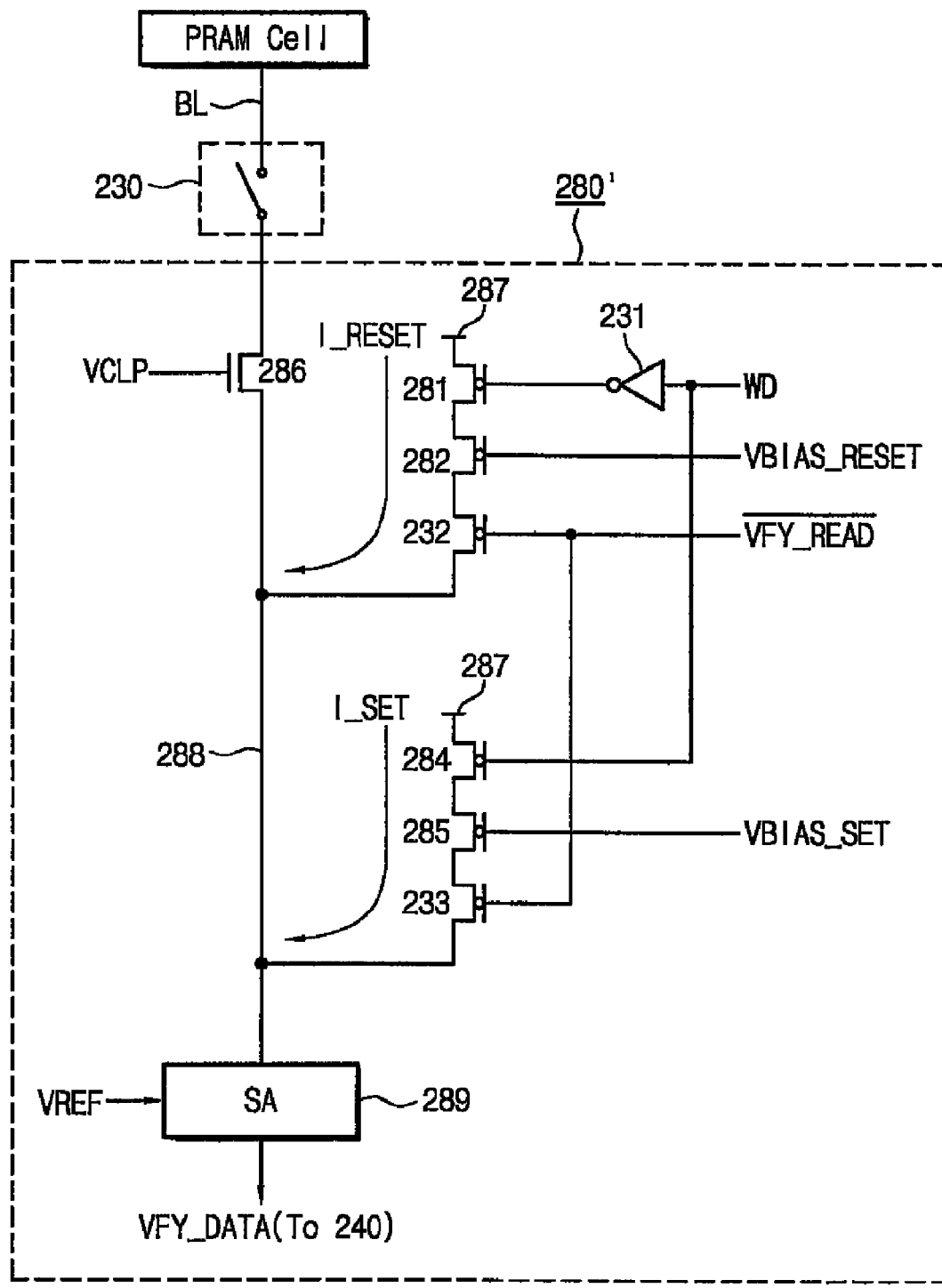

FIGS. 7A and 7B are circuit diagrams illustrating second sense amplifier circuit 280 of FIG. 5. Second sense amplifier circuit 280 in FIGS. 7A and 7B corresponds to a single bit line; however, phase change memory device 200 typically includes a similar second sense amplifier circuit for each bit line.

Referring to FIG. 7A, second sense amplifier circuit 280 comprises PMOS transistors 281, 282, 284 and 285, a switch controller 283, and a sense amplifier 289.

Switch controller 283 receives a control signal /VFY_READ indicating a verify read operation and the program data and generates switch control signals CSW0 and CSW1 in response to control signal /VFY_READ and the program data. Control signal /VFY_READ is supplied from control logic unit 240, and program data WD is supplied from data input/output buffer circuit 270. Where control signal /VFY_READ is deactivated, switch control signals CSW0 and CSW1 are deactivated to logic level "high" regardless of program data WD. Where control signal /VFY_READ is activated, i.e., in the verify read operation, one of switch control signals CSW0 and CSW1 is activated to logic level "low" according to program data WD. For example, switch control signal CSW1 is activated to logic level "low" where program data WD is a logical "1", and switch control signal CSW0 is activated to logic level "low" where program data WD is a logical "0".

Referring to FIG. 7A, PMOS transistors 281 and 282 are connected in series between a power terminal 287 and a signal line 288. A voltage corresponding to the power voltage or higher may be applied to power terminal 287. PMOS transistor 281 turns on/off in response to switch control signal CSW1 of switch controller 283, and PMOS transistor 282 turns on/off in response to bias voltage VBIAS_RESET. Bias voltage VBIAS_RESET is supplied from bias voltage generating circuit 300 of FIG. 5, which is greater than bias voltage VBIAS_SENSE supplied from first sense amplifier circuit 260. PMOS transistor 284 turns on/off in response to switch control signal CSW0 supplied from switch controller 283, and PMOS transistor 285 turns on/off in response to bias voltage VBIAS_SET. Bias voltage VBIAS_SET is supplied from bias voltage generating circuit 300 of FIG. 5, which is lower than bias voltage VBIAS_SENSE supplied from first sense amplifier circuit 260. NMOS transistor 286 is connected between signal line 288 and column select circuit 230, and is controlled by clamp voltage VCLP to restrict the bit line voltage. Clamp voltage VCLP may be commonly applied, or separately applied to first and second sense amplifier circuits 260 and 280. Sense amplifier circuit 289, labeled SA, senses whether the bit line voltage is lower or higher than reference voltage VREF through column select circuit 230, and outputs a resulting sensed result to control logic unit 240 of FIG. 5 as verify data VFY_DATA.

PMOS transistors 281 and 282 constitute a first verify current supplying part supplying verify current I_RESET to signal line 288 (i.e., bit line BL) in the verify read operation, wherein the magnitude of verify current I_RESET is determined by bias voltage VBIAS_RESET. Verify current I_RESET, as illustrated in FIG. 4, may be generated when bias voltage VBIAS_RESET greater than bias voltages VBIAS_SENSE is applied to PMOS transistor 282. Verify current I_RESET is supplied to the selected memory cell through the bit line in the verify read operation.

Similarly, PMOS transistors 284 and 285 constitute a second verify current supplying part supplying verify current I_SET to signal line 288 (i.e., bit line BL) in the verify read operation, wherein the magnitude of verify current I_SET is determined by bias voltage VBIAS_SET. Verify current I_SET, as illustrated in FIG. 4, may be generated when bias voltage VBIAS_SET lower than bias voltage VBIAS_SENSE is applied to the PMOS transistor 285. The verify current I_SET is supplied to the memory cell through the bit line in the verify read operation.

As described in relation to FIG. 4, the magnitude of verify current I_RESET supplied by first verify current supplying part 281 and 282 is smaller than the magnitude of verify current I_SET supplied by second verify current supplying part 284 and 285. In the verify read operation, only one of verify currents I_RESET and I_SET is supplied to the selected memory cell according to program data WD. For example, where the program data is a logical "1" in the verify read operation, switch control signal CSW1 is activated to logic level "low" and switch control signal CSW0 is deactivated to logic level "high". First verify current supplying part 281 and 282 generates verify current I_RESET with a magnitude determined by bias voltage VBIAS_RESET. Since PMOS transistor 284 turns off in response to switch control signals CSW0, verify current I_SET is not generated. On the other hand, where program data is a logical "0", switch control signal CSW0 is activated to logic level "low" and switch control signal CSW1 is deactivated to logic level "high". Second verify current supplying part 284 and 285 generates verify current I_SET with a magnitude determined by bias voltage VBIAS_SET. PMOS transistor 281 is turned off by switch control signal CSW1 so that verify current I_RESET is not generated.

Assuming that PMOS transistors 282 and 285 have the same size, the magnitude of the verify current is controlled by bias voltages VBIAS_RESET and VBIAS_SET. Alternatively, the magnitude of the verify current may be controlled by adjusting the sizes of PMOS transistors 282 and 285 assuming that bias voltages VBIAS_RESET and VBIAS_SET have the same voltage level.

Referring to FIG. 7B, second sense amplifier circuit 280' may be configured such that the verify current is applied to bit line BL according to program data WD only during the verify read operation. Sense amplifier circuit 280' of FIG. 7B operates only when control signal /VFY_READ is activated to logic level "low". Sense amplifier circuit 280' does not operate when control signal /VFY_READ is deactivated to logic level "high".

Figure 8:
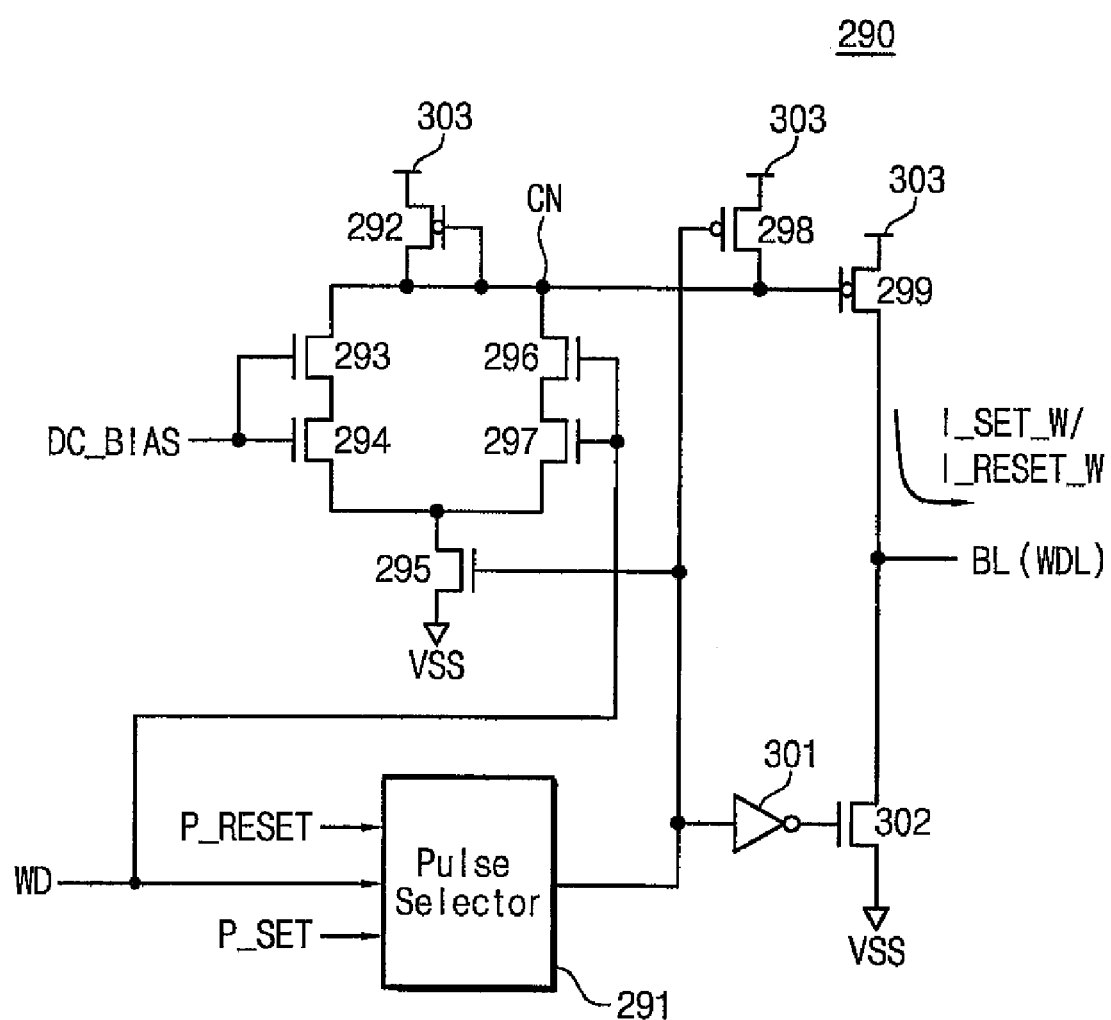
FIG. 8 is a circuit diagram illustrating an embodiment of a write driver circuit illustrated in FIG. 5.

FIG. 8 is a circuit diagram illustrating write driver circuit 290 of FIG. 5. Write driver circuit 290 illustrated in FIG. 8 corresponds to a single bit line; however, phase change memory device 200 typically comprises a write driver circuit for each bit line.

Referring to FIG. 8, write driver circuit 290 comprises a pulse selector 291, PMOS transistors 292, 298 and 299, an inverter 301, and NMOS transistors 293, 294, 295, 296, 297 and 302. Pulse selector 291 selects one signal between a set pulse signal P_SET and a reset pulse signal P_RESET according to program data WD. Where program data WD is a logical "1", pulse selector 291 selects reset pulse signal P_RESET. On the other hand, where program data WD is a logical "0", pulse selector 291 selects set pulse signal P_SET. PMOS transistor 292 is connected between a power terminal 303 and a control node CN, and is controlled by a voltage level of control node CN. A power voltage or higher is typically applied to power terminal 303.

Pulse signals P_SET and P_RESET are supplied from control logic unit 240 of FIG. 5, and the pulse width of set pulse signal P_SET may be greater than that of set pulse signal P_RESET. NMOS transistors 293, 294 and 295 are connected in series between control node CN and ground VSS. A bias voltage DC_BIAS is commonly applied to the respective gates NMOS transistors 293 and 294, and the pulse signal selected by pulse selector 291 is applied to the gate of NMOS transistor 295. Bias voltage DC_BIAS is supplied from bias voltage generating circuit 300. Bias voltage DC_BIAS increases gradually with successive program loops such that the magnitude of current applied to bit line BL gradually increases with each program loop.

NMOS transistors 296 and 297 are connected in series between control node CN and drain of NMOS transistor 295, and are commonly controlled by program data WD. PMOS transistor 298 is connected between power terminal 303 and control node CN, and is controlled by the pulse signal selected by pulse selector 291. PMOS transistor 299, which is connected between power terminal 303 and a data line (or bit line), acts as a pull-up driver supplying current to the data line in response to the voltage level of control node CN. NMOS transistor 302 is connected between the data line (or bit line) and ground VSS. The pulse signal selected by pulse selector 291 is inverted by inverter 301, and the inverted pulse signal is applied to the gate of NMOS transistor 302. Here, NMOS transistor 302 acts as a pull-down driver discharging the data line in response to the output of inverter 301.

In the embodiment illustrated in FIG. 8, PMOS transistors 292 and 299 constitute a current mirror. NMOS transistors 293 and 294 constitute a current source controlled by bias voltage DC_BIAS, and NMOS transistors 296 and 297 constitute a current source controlled by the voltage level of the pulse signal selected by pulse selector 291. The magnitude of write current I_SET_W is relatively small when generated using one current source 293 and 294 as opposed to when generated using two current sources 293/294 and 296/297. By controlling the level of bias voltage DC_BIAS, it is possible to control the amount of write current supplied through PMOS transistor 299. Herein, PMOS and NMOS transistors 292-298 constitute a control voltage generator for generating the control voltage to control node CN in response to the pulse signal selected by pulse selector 291, program data WD, and bias voltage DC_BIAS.

Control logic unit 240 typically generates set and reset pulse signals P_SET and P_RESET in the program operation. In response to set and reset pulses P_SET and P_RESET, bias voltage DC_BIAS is applied to the gates of NMOS transistors 293 and 294. Under these conditions, where program data WD is a logical "1" to place the selected memory cell in the RESET state, pulse selector 291 selects reset pulse signal P_RESET. Accordingly, PMOS and NMOS transistors 298 and 302 are turned off and NMOS transistor 295 is turned on. At the same time, NMOS transistors 296 and 297 are turned on by program data WD.

PMOS transistor 299, acting as the pull-up driver, supplies write current I_RESET_W to the bit line (or the data line) in response to the voltage level of control node CN. On the other hand, where program data WD is a logical "0" to place the selected memory cell in the SET state, pulse selector 291 selects set pulse signal P_SET. Accordingly, PMOS and NMOS transistors 298 and 302 are turned off and NMOS transistor 295 is turned on. At the same time, NMOS transistors 296 and 297 are turned off in response to program data WD. PMOS transistor 299 as the pull-up driver supplies the write current I_SET_W to the bit line (or the data line) in response to the voltage level of control node CN.

The voltage level of control node CN generated when NMOS transistors 293, 294, 296 and 297 are turned on (hereinafter, referred to as the first control voltage) is lower than the voltage level of control node CN generated when NMOS transistors 293 and 294 are turned on (hereinafter, referred to as the second control voltage). As a result, the magnitude of current I_RESET_W where the first control voltage is applied to the gate of PMOS transistor 299 is greater than the magnitude of current I_SET_W where the first control voltage is applied to the gate of PMOS transistor 299.

The magnitude of current I_RESET_W where the first control voltage is applied to the gate of PMOS transistor 299 is typically designed to change the phase change layer of the selected memory cell into the amorphous state. Similarly, the magnitude of current I_SET_W where the first control voltage is applied to the gate of PMOS transistor 299 is typically designed to change the phase change layer of the selected memory cell into the crystalline state.

Figure 9:
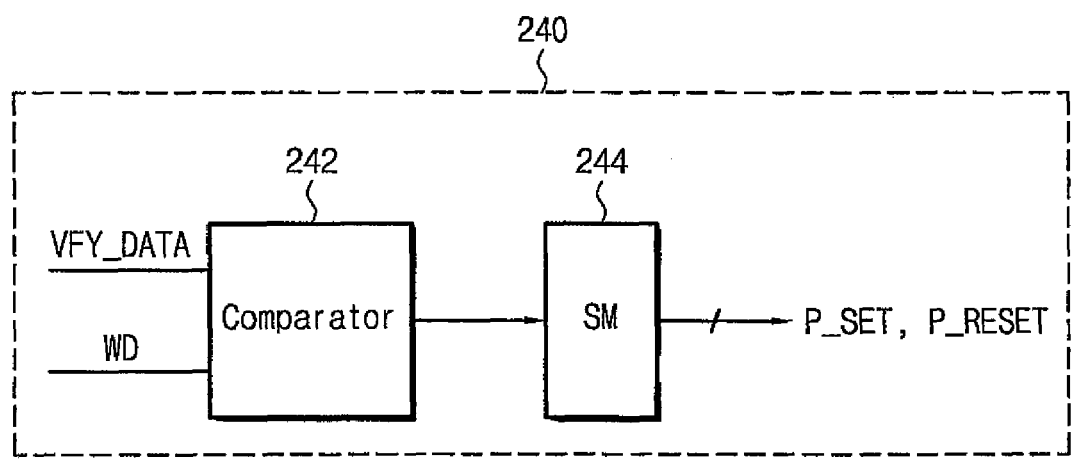
FIG. 9 is a block diagram illustrating a portion an embodiment of a control logic unit illustrated in FIG. 5.

FIG. 9 is a block diagram illustrating a portion of the control logic illustrated in FIG. 5.

Referring to FIG. 9, control logic unit 240 comprises a comparator 242 and a state machine 244 (labeled SM in FIG. 9). During the verify read operation, comparator 242 determines whether or not verify data VFY_DATA stored in second sense amplifier circuit 280 is identical to program data WD stored in data input/output buffer circuit 270 and generates a comparison result based on the comparison. During the program operation, state machine 244 controls the generation of pulse signals P_SET and P_RESET to be supplied to write driver circuit 280 in response to the comparison result of comparator 242. For example, where verify data VFY_DATA of second sense amplifier circuit 280 is identical to program data WD of data input/output buffer circuit 270, state machine 244 does not generate pulse signals P_SET and P_RESET. As a result, PMOS and NMOS transistors 298 and 302 are turned on and NMOS transistor 295 of FIG. 8 is turned off. Accordingly, the current is not applied to the bit line (or the data line) and the program operation is not performed.

On the other hand, where verify data VFY_DATA stored in second sense amplifier circuit 280 is not identical to program data WD stored in data input/output buffer circuit 270, state machine 244 generates pulse signals P_SET and P_RESET. As a result, current I_SET_W or I_RESET_W is supplied to the bit line (or the data line) by the same method as described above in relation to FIG. 8.

Figure 10:
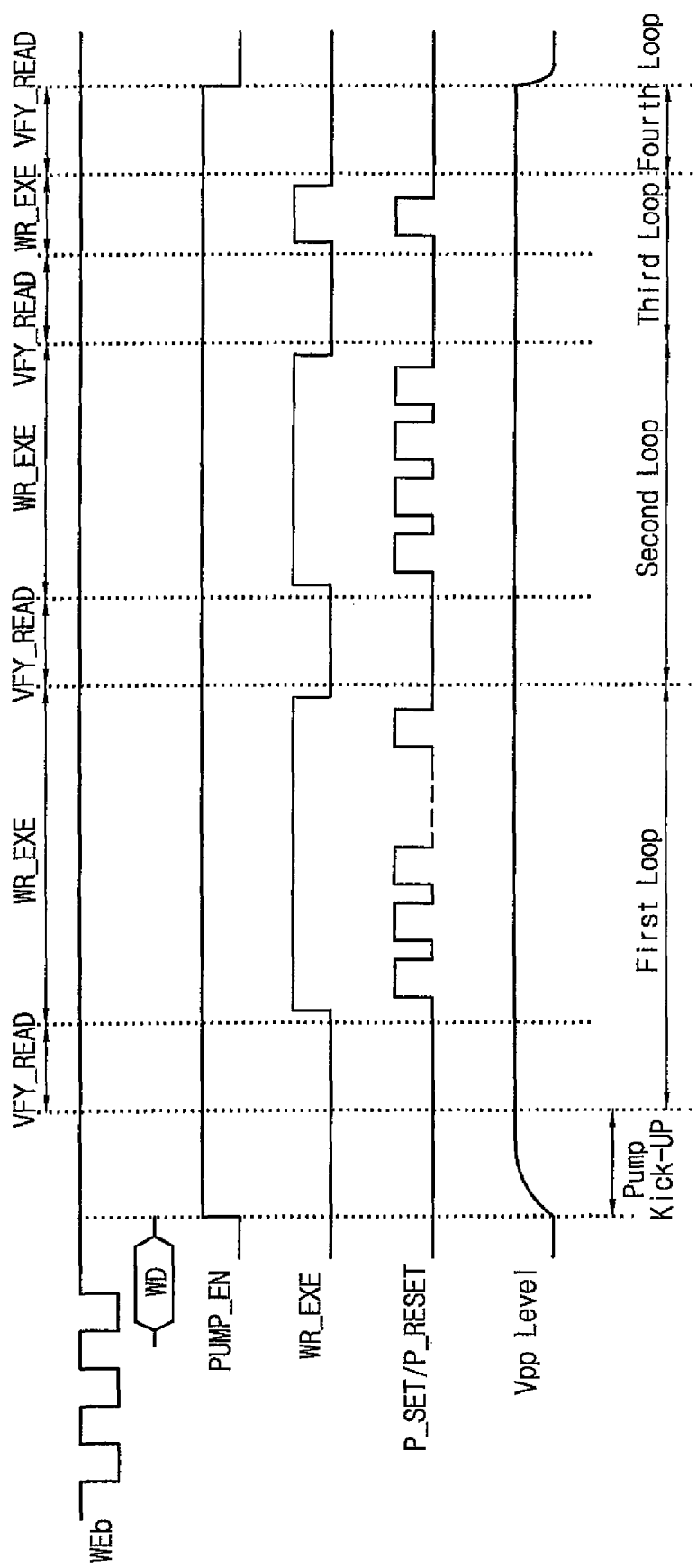
FIG. 10 is a timing diagram illustrating a program operation of the phase change memory device of FIG. 5 according to one embodiment of the present invention.

FIG. 10 is a timing diagram illustrating a program operation of phase change memory device 200 according to an embodiment of the present invention. In general, the program operation is performed by repeating a plurality of program loops, wherein each of the program loops comprises a verify read operation (or section) and a program execution operation (or section). In the example of FIG. 10, it will be assumed that 16 bits of program data are programmed to phase change memory device during the program operation.

The 16 bits can be programmed simultaneously, sequentially, or in units of N-bits (N is an integer and N>1); however, for convenience of illustration, it will be assumed that the program data is programmed sequentially, one bit at a time. In this case, control logic unit 240 successively generates set and reset pulse signals P_SET and P_RESET corresponding to respective program data bits in each program loop. For example, in each program loop, phase change memory device 200 first generates set and reset pulse signals P_SET and P_RESET corresponding to a first program data bit, followed by set and reset pulse signals P_SET and P_RESET corresponding to a second program data bit, and so on.

In order to perform the program operation, row and column addresses RA and CA are typically applied to phase change memory device 200 from an external source such as a host or a memory controller. Row address RA is transferred to row select circuit 220, and column address CA is transferred to column select circuit 230. Thereafter, program data WD is supplied to data input/output buffer circuit 270. Once program data WD is input, control logic unit 240 activates a pump enable signal PUMP_EN to logic level "high", and high-voltage generating circuit 250 starts generating a high voltage in response to the activation of pump enable signal PUMP_EN. Thereafter, the verify read operation of the first program loop is performed during a read verify section labeled VFY_READ. The verify read operation is performed by second sense amplifier circuit 280. During the verify read operation, first sense amplifier circuit 260 is deactivated by control logic unit 240. That is, control signal /READ applied to first sense amplifier circuit 260 is maintained at logic level "high".

In the verify read operation, bias voltages VBIAS_RESET and VBIAS_SET are respectively applied to PMOS transistors 282 and 285 of second sense amplifier circuit 280 from bias voltage generating circuit 300 under the control of control logic unit 240. Where program data WD of data input/output buffer circuit 270 is a logical "1" to place the selected memory cell in the RESET state, switch controller 283 activates switch control signal CSW1 to logic level "low" and deactivates switch control signal CSW0 to logic level "high". As a result, PMOS transistor 281 of second sense amplifier circuit 280 turns on in response to switch control signal CSW1 and PMOS transistor 284 of second sense amplifier circuit 280 turns off in response to switch control signal CSW0. Accordingly, verify current I_RESET is applied to signal line 288, i.e., bit line BL, through PMOS transistors 281 and 282. Under such conditions, cell data may be sensed through sense amplifier 289.

Where the magnitude of current flowing through the selected memory cell is smaller than the magnitude of verify current I_RESET, the bit line voltage is higher than the reference voltage. At this time, sense amplifier 289 senses the bit line voltage, and outputs the sensed result to control logic unit 240 as verify data VFY_DATA. Where verify data VFY_DATA indicates that the magnitude of current flowing through the selected memory cell is smaller than the magnitude of verify current I_RESET, it is determined that the selected memory cell is in the RESET state as desired.

On the other hand, where the magnitude of current flowing through the selected memory cell is larger than the magnitude of verify current I_RESET, the bit line voltage is lower than the reference voltage. Here, sense amplifier 289 senses the bit line voltage and outputs the sensed result to control logic unit 240 as the verify data VFY_DATA. Where the verify data VFY_DATA indicates that the magnitude of cell current flowing through the selected memory cell is greater than the magnitude of verify current I_RESET, it is determined that the selected memory cell is not in the RESET state as desired.

Where it is determined that the selected memory cell is in the RESET state, the program operation no longer applies a program current to the selected memory cell in further program loops. Otherwise, the program operation will apply the program current to the selected memory cell in further program loops under the control of control logic unit 240.

Where the program data stored in data input/output buffer circuit 270 is a logical "0" to program the selected memory cell into the SET state, switch controller 283 activates switch control signal CSW0 to logic level "low" and deactivates switch control signal CSW1 to logic level "high". PMOS transistor 284 of second sense amplifier circuit 280 turns on in response to switch control signal CSW0 and PMOS transistor 281 of second sense amplifier circuit 280 turns off in response to switch control signal CSW1. Accordingly, verify current I_SET is applied to signal line 288 through PMOS transistors 284 and 285. Under these conditions, cell data is sensed through sense amplifier 289, as described in further detail below.

Where the magnitude of cell current flowing through the selected memory cell is greater than the magnitude of verify current I_SET, the bit line voltage becomes lower than the reference voltage. Accordingly, sense amplifier 289 senses the bit line voltage and outputs the sensed result to control logic unit 240 as verify data VFY_DATA. Where verify data VFY_DATA indicates that the magnitude of current flowing through the selected memory cell is greater than the magnitude of verify current I_SET, it is determined that the selected memory cell is in the SET state as desired.

On the other hand, where the magnitude of current flowing through the selected memory cell is smaller than the magnitude of verify current I_SET, the bit line voltage becomes higher than the reference voltage. Here, sense amplifier 289 senses the bit line voltage and outputs the sensed result to control logic unit 240 as verify data VFY_DATA. Where verify data VFY_DATA indicates that the magnitude of current flowing through the selected memory cell is smaller than the magnitude of verify current I_SET, it is determined that the selected memory cell is not in the SET state as desired.

In summary, where it is determined that the selected memory cell is in the SET state as desired, the program operation no longer applies a program current to the selected memory cell in further program loops. Otherwise, the program operation applies the program current to the selected memory cell in further program loops under the control of control logic unit 240.

Once the verify read operation of the first program loop is completed, verify data VFY_DATA sensed by second sense amplifier circuit 280 is output to control logic unit 240, as described above. Control logic unit 240 determines whether or not program data WD stored in buffer circuit 270 is identical to verify data VFY_DATA. Where program data WD is identical to verify data VFY_DATA, control logic unit 240 does not generate pulse signals P_SET and P_RESET corresponding to program data WD. As a result, the write current is not applied to the selected memory cell in further program loops. Where program data WD is not identical to the verify data VFY_DATA, control logic unit 240 generates pulse signals P_SET and P_RESET based on program data WD. Accordingly, write current I_SET_W and I_RESET_W is supplied to the bit line from write driver circuit 290.

Figure 11:
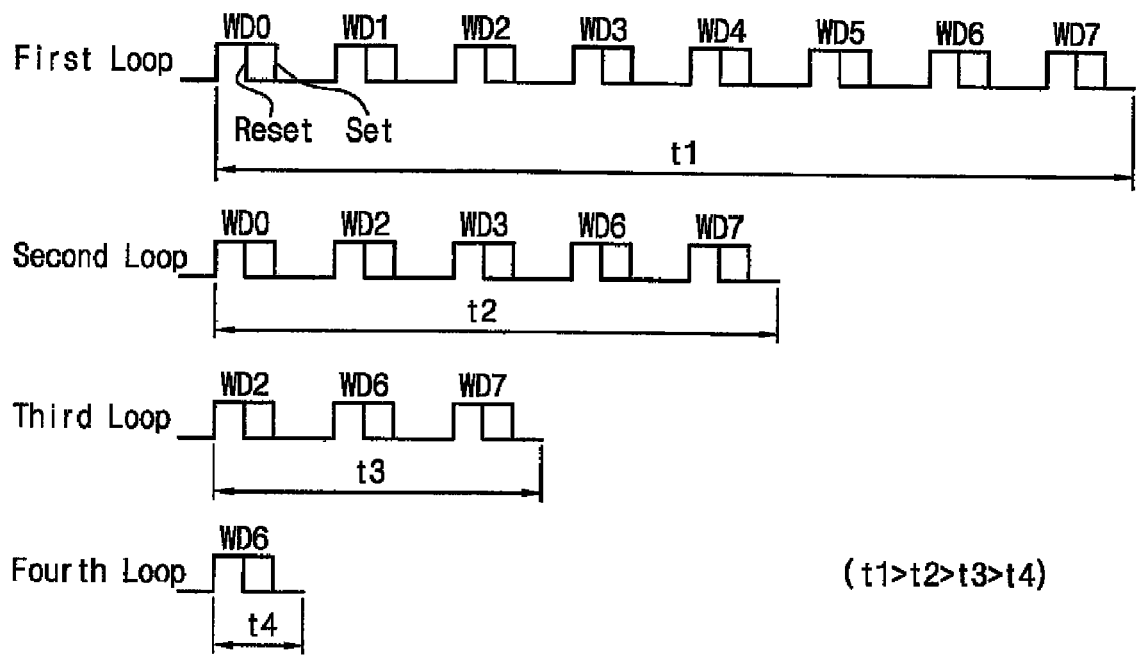
FIG. 11 is a schematic view illustrating pulse signals generated in successive program loops of the program operation illustrated in FIG. 10.

Since the program operation programs 16 bits of program data to phase change memory device 200, at most 16 set and reset pulse signals will be generated during the write execution section. Where some of the 16 bits of program data are identical to corresponding verify data bits, set or reset pulses will not be generated for these bits. On the other hand, pulse signals corresponding to respective program data bits which are not identical to corresponding verify data bits, as illustrated in FIG. 11, will be generated sequentially. As a result, the duration of successive program loops will tend to decrease.

Once the first program loop completes, a second program loop is performed similar to the first program loop. In verify read sections of program loops, selected memory cells not programmed into desired states are detected. Then, in program sections of the program loops, respective program currents are supplied selected memory cells detected not to be in desired states.

Using the above described techniques, the selected memory cells can be programmed to within desired resistance distributions such as those illustrated by dotted lines in FIG. 4, achieving desired read margins for the selected memory cells.

Figure 12:
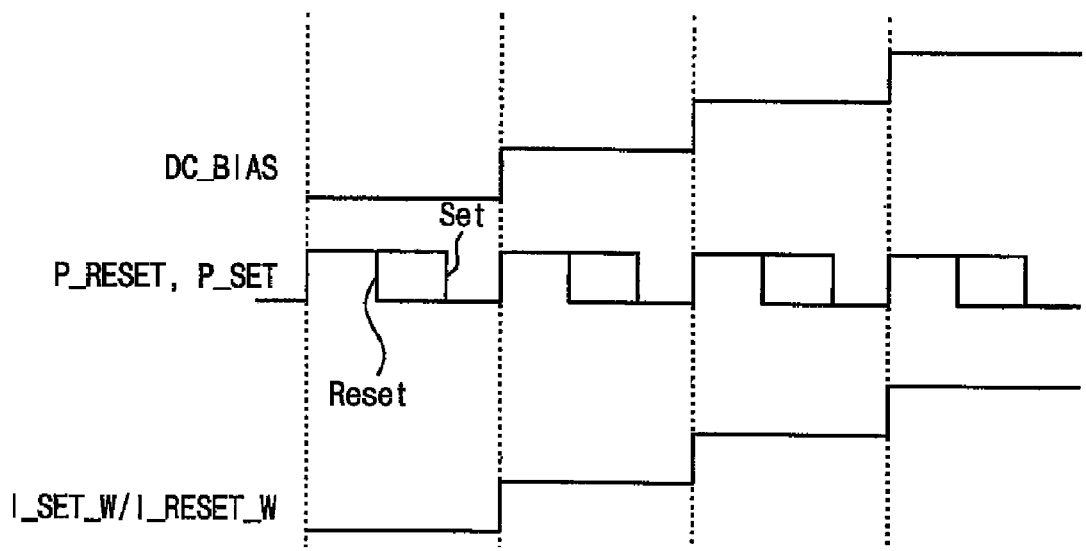
FIG. 12 is a schematic view illustrating a change of a program current in successive program loops of the program operation illustrated in FIG. 10.

In the method described above in relation to FIG. 10, the magnitude of current supplied from write driver circuit 290 is adjusted with successive program loops. This may be achieved by gradually increasing bias voltage DC_BIAS applied to write driver circuit 290 with an increasing program loop count, as illustrated in FIG. 12. As bias voltage DC_BIAS gradually increases, the magnitude of write current I_SET_W/I_RESET_W also increases gradually with successive program loops. Where the magnitude of the write current is relatively small, SET/RESET states of phase change memory cells having lower electrodes with relatively small radii are more quickly changed in comparison with phase change memory cells having lower electrodes with relatively larger radii.

Since memory cells having changed SET/RESET states are prevented from being further programmed after reaching desired states, programming of memory cells having lower electrodes with relatively smaller radii tend to be completed more quickly than programming of memory cell having the lower electrode with the relatively larger radii.

Rather than programming memory cells using sequentially applied pulses, as described above, selected memory cells could be programmed simultaneously. For example, control logic unit 240 could simultaneously generate set and reset pulse signals P_SET and P_RESET corresponding to multiple program data bits. However, in this case, only set and reset pulse signals P_SET and P_RESET corresponding to selected memory cells that have not yet reached desired states will be generated. As described above, set and reset pulse signals P_SET and P_RESET corresponding to the respective program data bits which are identical to the verify data bits are not generated.

Figure 13:
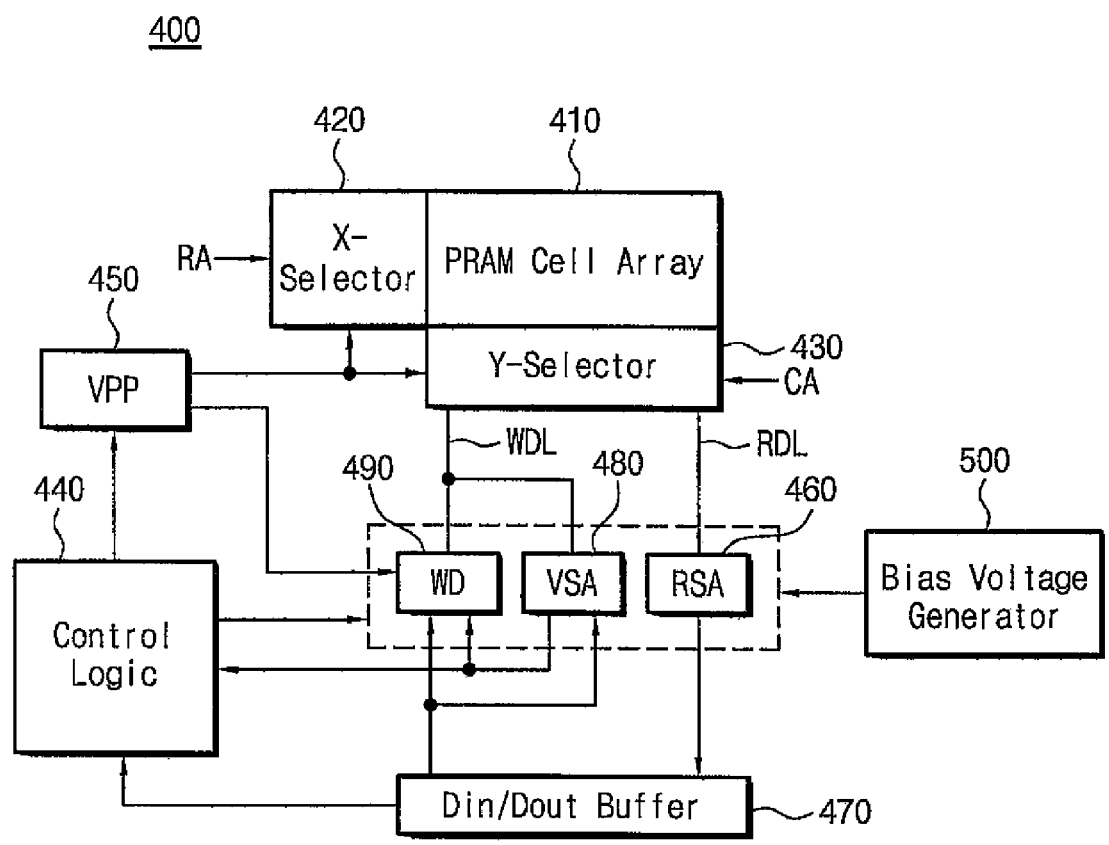
FIG. 13 is a block diagram illustrating a phase change memory device according to another embodiment of the present invention.

FIG. 13 is a block diagram illustrating a phase change memory device according to another embodiment of the present invention. In a phase change memory device 400 of FIG. 13, a memory cell array 410, a row select circuit 420, a column select circuit 430, a high voltage generating circuit 450, first and second sense amplifier circuits 460 and 480, a data input/output buffer circuit 470, and a bias voltage generating circuit 500 operate in a similar manner as corresponding elements in phase change memory device 200 illustrated in FIG. 5. Accordingly, further descriptions of these elements will be omitted to avoid redundancy.

In the verify read operation, a control logic unit 440 compares verify data output from second sense amplifier circuit 480 with program data stored in data input/output buffer circuit 470. Control logic unit 440 selectively generates pulse signals according to a result of the comparison. For example, where the verify data is identical to the program data, the pulse signals corresponding to the data are not generated, and where the verify data is not identical to the program data, pulse signals corresponding to the data are generated. The pulse signals corresponding to the respective program data which are not identical to the corresponding verify data bits may be generated in the same manner as illustrated in FIG. 11. Accordingly, the program loop duration will tend to decrease with successive program loops. As successive program loops are performed, control logic unit 240 controls bias voltage generating circuit 500 such that bias voltage DC_BIAS applied to second sense amplifier circuit 280 gradually increases.

Write driver circuit 490 supplies the write current to a data line WDL in response to the pulse signals supplied from control logic unit 240, verify data provided by second sense amplifier circuit 280, and program data generated by data input/output buffer circuit 470.

Figure 14:
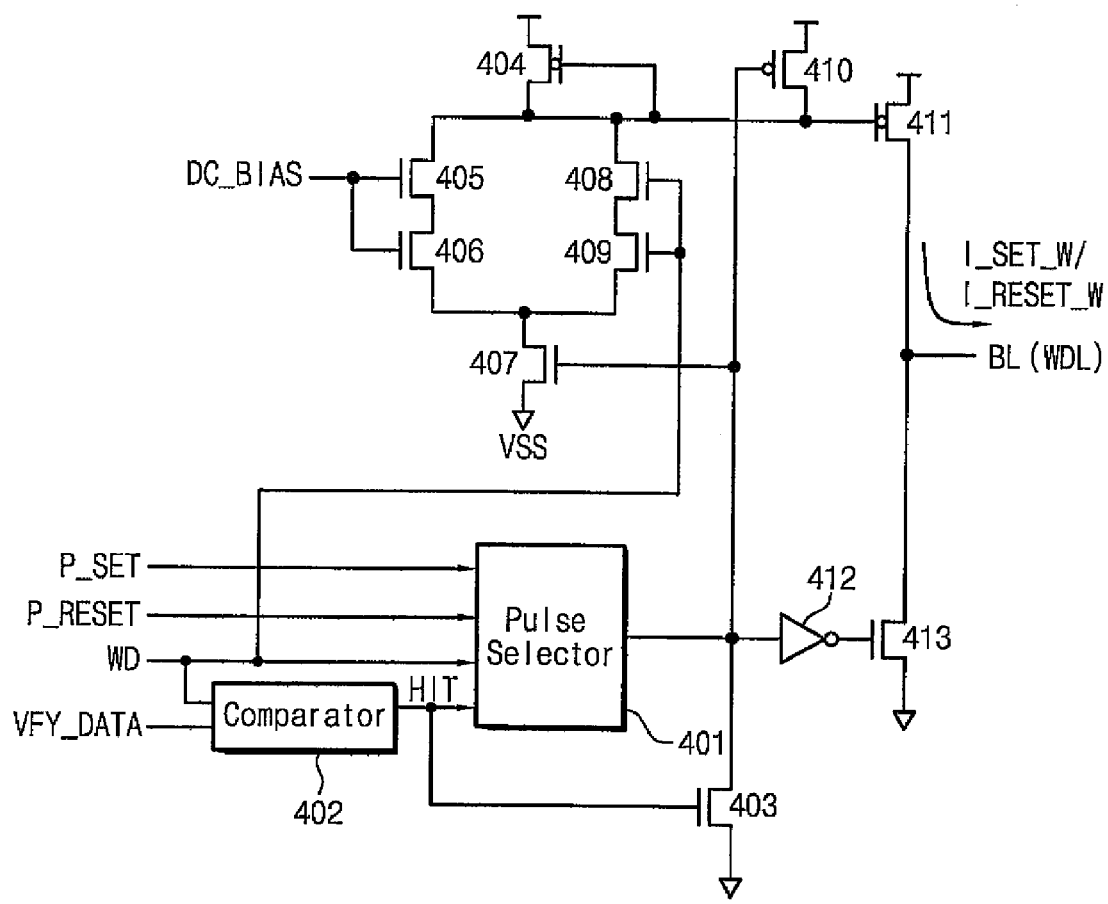
FIG. 14 is a block diagram illustrating an embodiment of a write driver in the phase change memory device of FIG. 13.

Referring to FIG. 14, write driver circuit 490 is similar to write driver circuit 290, but further comprises a comparator 402 and an NMOS transistor 403. Comparator 402 detects whether or not verify data VFY_DATA is identical to program data WD. Where verify data VFY_DATA is identical to program data WD, comparator 402 activates a hit signal HIT to logic level "high". On the other hand, where verify data VFY_DATA is not identical to program data WD, comparator 402 deactivates hit signal HIT to logic level "low".

Where hit signal HIT is activated to logic level "high", pulse selector 401 does not output any of pulse signals P_SET and P_RESET regardless of program data WD. Instead, NMOS transistor 413 is turned on, and PMOS transistor 410 is turned off. As a result, the bit line (or data line) is grounded through NMOS transistor 412 and the write current is not supplied to the bit line. Where hit signal HIT is deactivated to logic level "low", pulse selector 401 selects one of pulse signals P_SET and P_RESET according to program data WD. Where the pulse signal is selected by pulse selector 401, write driver circuit 490 operates in a manner substantially identical write driver circuit 290 of FIG. 8. Accordingly, the operation of write driver circuit 490 where pulse selector 401 selects the pulse signal will be omitted to avoid redundancy.

With the exception of control logic unit 440 and write driver circuit 490, phase memory device 400 of FIG. 13 operates in substantially the same manner as phase change memory device 200. Accordingly, a further description of phase change memory device 400 will be omitted to avoid redundancy.

Figure 15:
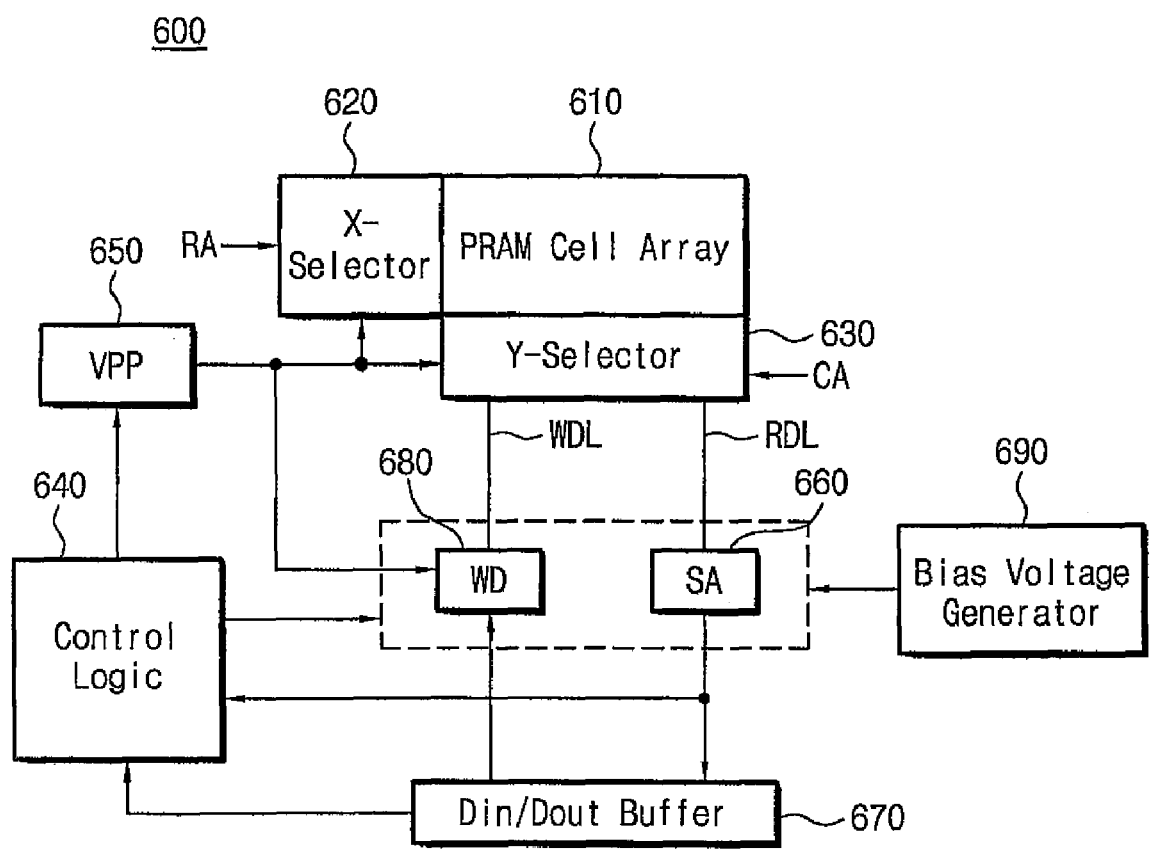
FIG. 15 is a block diagram illustrating a phase change memory device according to yet another embodiment of the present invention.
Figure 16:
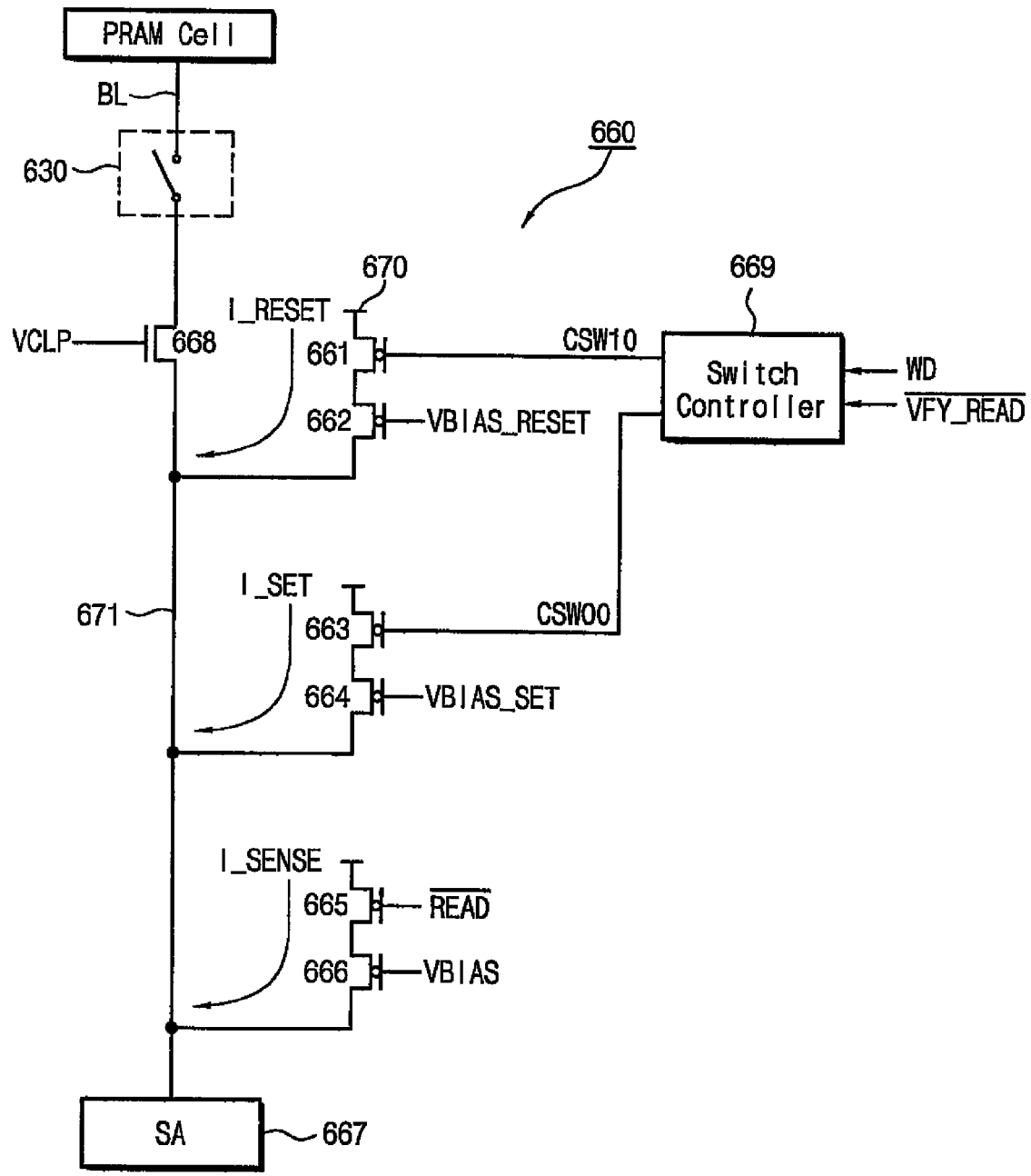
FIG. 16 is a circuit diagram illustrating an embodiment of a sense amplifier circuit in the phase change memory device of FIG. 15.

FIG. 15 is a block diagram illustrating a phase change memory device according to yet another embodiment of the present invention, and FIG. 16 is a circuit diagram illustrating a sense amplifier of FIG. 15. In a phase change memory device 600 of FIG. 15, a memory cell array 610, a row select circuit 620, a column select circuit 630, a control logic 640, a high voltage generating circuit 650, a data input/output buffer circuit 670, a write driver circuit 680, and a bias voltage generating circuit 690 operate in substantially the same manner as corresponding elements in phase change memory device 200 illustrated in FIG. 5. Accordingly, further descriptions of these elements will be omitted to avoid redundancy.

Unlike phase change memory device 200, sense amplifier circuit 660 of FIG. 15 performs sensing operations in verify read operations and normal read operations. As illustrated in FIG. 16, sense amplifier circuit 660 comprises PMOS transistors 661, 662, 663, 664, 665 and 666, an NMOS transistor 668, a sense amplifier 667, and a switch controller 669. Switch controller 669 activates one of switch control signals CSW00 and CSW10 to logic level "low" according to program data WD in the verify read operation. Switch controller 669 deactivates switch control signals CSW00 and CSW10 to logic level "high" where control signal /VFY_READ does not indicate the verify read operation.

PMOS transistors 661 and 662 constitute a verify current supplying part supplying verify current I_RESET (see FIG. 4) in response to switch control signal CSW10 and bias voltage VBIAS_RESET. PMOS transistors 663 and 664 constitute a verify current supplying part supplying verify current I_SET (see FIG. 4) in response to switch control signal CSW00 and bias voltage VBIAS_SET. Similarly, PMOS transistors 665 and 666 constitute a sense current supplying part supplying sense current I_SENSE (see FIG. 4) in response to control signal /READ and bias voltage VBIAS in the normal read operation. As it is understood from the above illustration, verify current I_RESET or I_SET is applied to the bit line in the verify read operation, and sense current I_SENSE is applied to the bit line in the normal read operation.

Except for the above-described differences, phase memory device 600 of FIG. 15 operates in substantially the same manner as phase change memory device 200 of FIG. 5. Accordingly, further description of phase change memory device 600 will be omitted to avoid redundancy.

Figure 17:
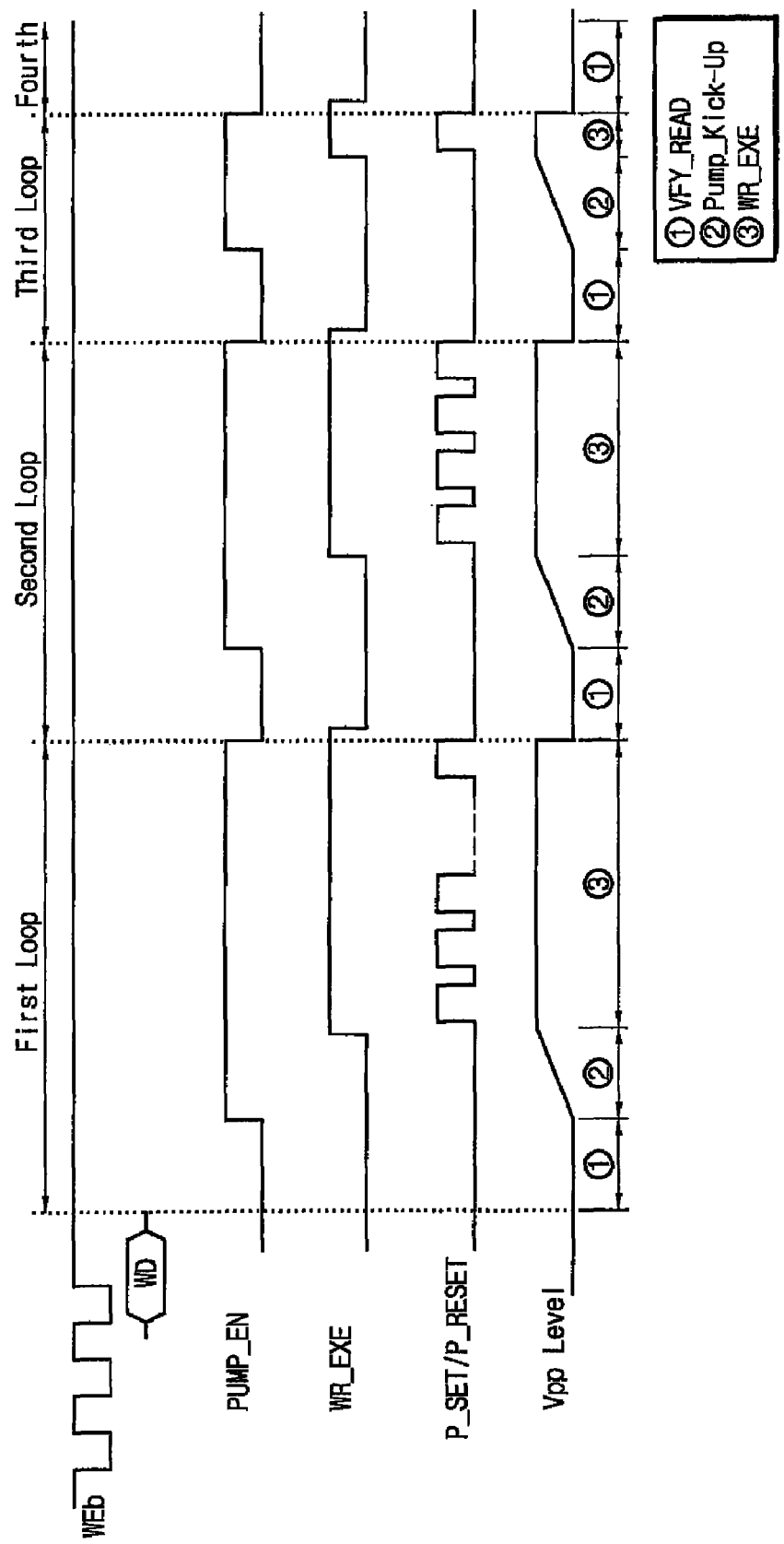
FIG. 17 is a timing diagram illustrating a program operation of the phase change memory device of FIG. 15.

FIG. 17 is a timing diagram illustrating a program operation of phase change memory device 600 of FIG. 15. The timing diagram of FIG. 17 is substantially identical to that of FIG. 10 with the exception that in FIG. 17, there is an additional section PUMP_KICK-UP used to generate a high voltage with a level higher than the power voltage in every program loop. During the section PUMP_KICK-UP, the high voltage is generated by high voltage generating circuit 650. The high voltage is required for program operations, but is not required for read operations. For this reason, high voltage generating circuit 650 is deactivated during the verify read operation. Since a predetermined time is required to generate the high voltage, the section PUMP_KICK-UP is required between the verify read section and the write execution section where one sense amplifier circuit is used. With the above exception, the timing diagram of FIG. 17 is substantially same as the timing diagram of FIG. 10. Accordingly, additional description of the timing diagram of FIG. 17 will be omitted to avoid redundancy.

Figure 18:
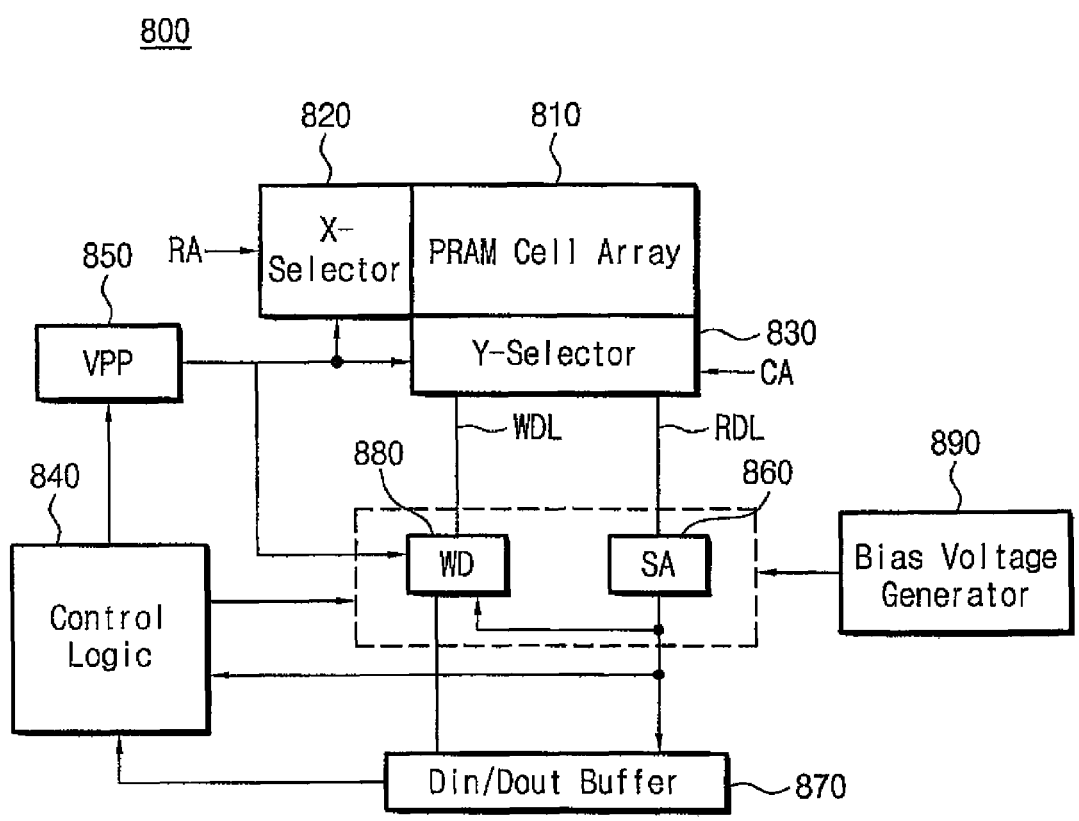
FIG. 18 is a block diagram illustrating a phase change memory device according to still another embodiment of the present invention.

FIG. 18 is a block diagram illustrating a phase change memory device according to still another embodiment of the present invention.

Referring to FIG. 18, a phase change memory device 800 is substantially identical to phase change memory device 200, except that the verify data are applied to a write driver circuit 880 in phase change memory device 800. Write driver circuit 880 selectively supplies the write current according to the verify data, and has a configuration substantially identical to write driver circuit 490 of FIG. 14. Remaining elements of phase change memory device 800 illustrated in FIG. 18 are substantially identical corresponding elements in phase change memory device 600 illustrated in FIG. 15, and therefore further descriptions of these elements are omitted in order to avoid redundancy.

Phase change memory devices are nonvolatile memory devices capable of retaining stored data even when disconnected from an external power supply. Phase change memory devices support random data access and provide high-speed data read and processing performance. As a result, phase change memory devices can be beneficially used for storing program code. As portable electronic devices such as cellular phones, personal digital assistants (PDA), digital cameras, portable game consoles, and MP3 players continue to proliferate, phase change memory devices can be used in these devices to provide data storage as well as code storage.

In addition, the phase change memory devices can also be beneficially used in home applications such as high-definition televisions (HDTVs), digital video disk (DVD) players, routers, and global positioning systems (GPS). An exemplary system including a phase change memory device according to one embodiment of the present invention is schematically illustrated in FIG. 19.

Figure 19:
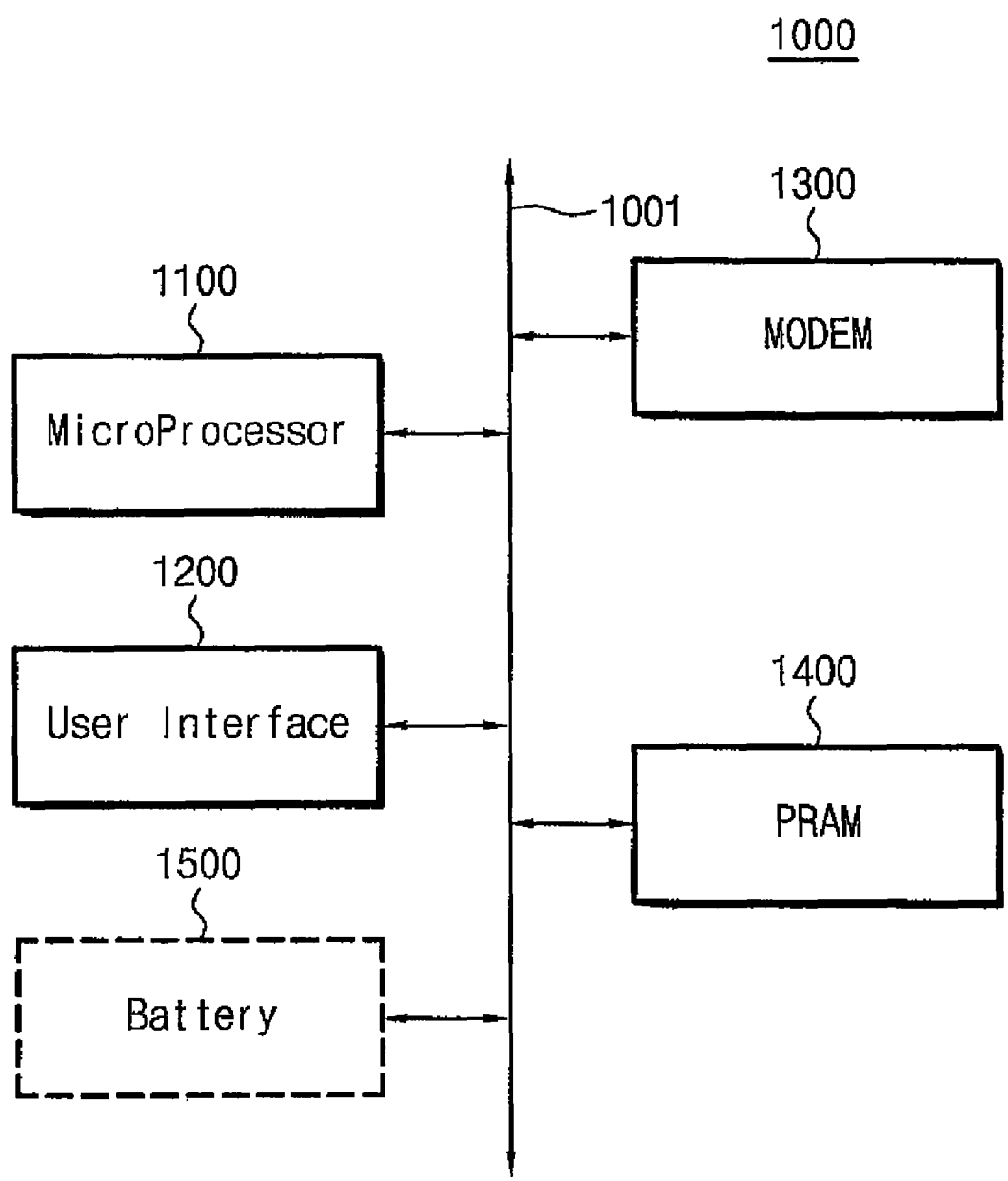
FIG. 19 is a block diagram illustrating a system including a phase change memory device according to an embodiment of the present invention.

Referring to FIG. 19, a system 1000 comprises a microprocessor 1100 electrically connected to a bus 1001, a user interface 1200, a modem 1300 such as baseband chipset, and a phase change memory device 1400 (denoted PRAM in FIG. 19). The label "PRAM" here denotes "phase change random access memory (RAM)". In system 1000, phase change memory device 1400 can be embodied, for example, by any of the phase change memory devices illustrated in FIGS. 5 through 17.

Phase change memory device 1400 stores N-bit data processed/to be processed by microprocessor 1100, where N is a positive integer. Where system 1000 comprises a mobile electronic device, a battery 1500 may be provided to supply operational power. Although not illustrated in FIG. 19, those skilled in the art will understand that system 1000 may further comprise other elements such as an application chipset, a camera image processor (CIS), a mobile DRAM, a NAND flash memory, and so on.

As described above, according to selected embodiments of the present invention, a program operation of selected memory cells is performed such that the selected memory cells assume states within SET/RESET state distributions such as those illustrated by dotted lines in FIG. 4. As a result, desired read margins, and consequently reliability can be achieved.

The foregoing exemplary embodiments are teaching examples. Those of ordinary skill in the art will understand that various changes in form and details may be made to the exemplary embodiments without departing from the scope of the invention as defined by the following claims.

What is claimed is:

1. A method of performing a program operation in a resistance-variable memory device comprising a plurality of resistance-variable memory cells, the method comprising:

supplying at least one pulse current to a selected resistance-variable memory cell;

sensing data stored in the selected resistance-variable memory cell by detecting an amount of a verify current flowing through the selected resistance-variable memory cell;

determining whether the sensed data is identical to data to be programmed in the selected resistance-variable memory cell; and if the sensed data is determined not to be identical to the data to be programmed, supplying a pulse current to the selected resistance-variable memory cell, a resistance value of the selected resistance-variable memory cell being changed by heat corresponding to the pulse current and the pulse current being increased when the supplying is repeated.

2. The method of claim 1, wherein the selected resistance-variable memory cell stores 1-bit data indicating either one of a RESET state and a SET state.

3. The method of claim 1, wherein the selected resistance-variable memory cell stores multi-bit data indicating one selected from a group of a SET state and a plurality of RESET states.

4. The method of claim 3, wherein the plurality of RESET states comprises a full RESET state and at least one intermediate RESET state defined between the full RESET state and the SET state.

5. The method of claim 4, wherein the at least one intermediate RESET state is defined between the full RESET state and the SET state to ensure a maximum read margin between respective ones of the plurality of RESET states and the SET state.

6. The method of claim 4, wherein the program operation comprises a multi-bit memory cell program operation and each one of the SET state and the plurality of RESET states is characterized by one resistance distribution selected from a plurality of resistance distributions.

7. The method of claim 1, wherein if the sensed data is determined to be identical to the data to be programmed, ending the program operation without further supplying the pulse current to the selected resistance-variable memory cell.

8. The method of claim 1, further comprising:
repeatedly performing the sensing, the determining, and the supplying until the data to be programmed for the selected resistance-variable memory cell is identical to the sensed data.

9. The method of claim 8, wherein sensing of data stored in the selected resistance-variable memory cell comprises performing a read verify operation using an applied read verify voltage following each supplying of the pulse current to the selected resistance-variable memory cell.

10. The method of claim 1, wherein the sensing, the determining, and the supplying ensure adequate control of a resistance value of the selected resistance-variable memory cell, and the pulse current speeds up the Joule effect directly to the point where its efficiency is maximum.

11. The method of claim 1, wherein as the supplying of the pulse current is repeated, an amplitude of the pulse current is gradually increased.

12. The method of claim 11, wherein as the supplying of the pulse current is repeated, the amplitude of the pulse current is gradually increased in an up staircase pattern.

13. The method of claim 1, wherein each one of the plurality of resistance-variable memory cells comprises a resistance-variable material exhibiting a SET state wherein amorphous nuclei of defined number and defined size range are formed, and at least one RESET state wherein amorphous nuclei are formed with at least one of a number greater than the defined number and a size range greater than the defined size range are formed.

14. The method of claim 1, wherein the pulse current is repeatedly supplied to the selected resistance-variable memory cell over a sequence of time periods as a sequence of box-shaped program pulses.

15. The method of claim 1, further comprising:
before supplying the at least one pulse current, initially conditioning the selected resistance-variable memory cell by applying at least one of a full SET current pulse and a RESET current pulse.

16. The method of claim 15, wherein before supplying the at least one pulse current, initially conditioning the selected resistance-variable memory cell by applying the RESET current pulse.

17. The method of claim 16, wherein the data to be programmed corresponds to the RESET state, and upon determining that the sensed data corresponds to the RESET state, ending the program operation without further supplying the pulse current to minimize a programming loop duration for the program operation.

18. A memory device comprising:
a memory array comprising a selected resistance-variable memory cell configured to store program data; and
a generator configured to generate a level-controlled program current and mirror the level-controlled program current throughout the memory array to iteratively apply the level-controlled program current to the selected resistance-variable memory cell,
wherein the level-controlled program current is gradually increased with each iterative application of the level-controlled program current until a programmed state for the selected resistance-variable memory cell is equal to the program data.

19. The memory device of claim 18, wherein the level-controlled program current is a pulse current applied to the selected resistance-variable memory cell during each iterative application.

20. The memory device of claim 19, wherein the generator comprises a pulse current selection circuit configured to select between at least one RESET pulse current and a SET pulse current on the basis of the program data.

21. The memory device of claim 19, wherein the pulse current is increased in an up staircase pattern with each successive iterative application.

22. The memory device of claim 18, wherein the memory array comprises a transistor configured to receive a high voltage provided by a high voltage generation circuit, be controlled by a bias voltage provided by the generator, and output the level-controlled program current in response to the high voltage and the bias voltage.

23. The memory device of claim 22, wherein the high voltage generation circuit comprises a charge pump.

24. The memory device of claim 22, wherein the level-controlled program current output by the transistor is applied to a data line connected to the selected resistance-variable memory cell.

25. The memory device of claim 22, wherein the data line connected to the selected resistance-variable memory cell is a bit line.

26. A memory device comprising:
an array of resistance-variable memory cells divided into a first memory block including a first selected memory cell and a second memory block including a second selected memory cell;
sensing and writing circuitry configured to simultaneously program the first and second selected memory cells with program data by iteratively applying a level-controlled program current to the first and second selected memory cells, and performing a verify read operation on the first and second selected memory cells until respective programmed states for the first and second memory cells are equal to the program data.

27. The device of claim 26, wherein prior to the simultaneous programming of the first and second selected memory cells, each one of the first and second memory blocks receives a reference voltage.

28. The device of claim 27, wherein the reference voltage is generated by a precharge circuit.

* * * * *